(12) United States Patent
Karashima et al.

(10) Patent No.: US 7,638,883 B2
(45) Date of Patent: Dec. 29, 2009

(54) FLIP CHIP MOUNTING METHOD AND BUMP FORMING METHOD

(75) Inventors: Seiji Karashima, Osaka (JP); Takashi Kitae, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 92 days.

(21) Appl. No.: 12/149,317

(22) Filed: Apr. 30, 2008

(65) Prior Publication Data

US 2008/0284046 A1 Nov. 20, 2008

Related U.S. Application Data

(62) Division of application No. 11/887,332, filed as application No. PCT/JP2006/305273 on Mar. 16, 2006, now Pat. No. 7,531,387.

(30) Foreign Application Priority Data

Mar. 29, 2005 (JP) ............... 2005-094232

(51) Int. Cl.
*H01L 23/48* (2006.01)
*H01L 23/52* (2006.01)
*H01L 29/40* (2006.01)

(52) U.S. Cl. ............... 257/778; 257/737; 257/E23.018; 156/556

(58) Field of Classification Search ........... 257/778, 257/737, 758, E23.018; 228/56.3; 174/261; 438/119, 108
See application file for complete search history.

(56) References Cited

U.S. PATENT DOCUMENTS

2002/0185309 A1 12/2002 Imamura et al.
2009/0126876 A1* 5/2009 Karashima et al. .......... 156/556

FOREIGN PATENT DOCUMENTS

JP 01-157796 6/1989
JP 06-125169 5/1994

(Continued)

OTHER PUBLICATIONS

Rito, Masahiro et al., "Assembly Process by Electrically Conductive Adhesive Using Low Melting Point Fillers," 9th Symposium on "Microjoining and Assembly Technology in Electronics," Feb. 6-7, 2003, Yokohama.

(Continued)

*Primary Examiner*—Walter L Lindsay, Jr.
(74) *Attorney, Agent, or Firm*—McDermott Will & Emery LLP

(57) ABSTRACT

A flip chip mounting method which is applicable to the flip chip mounting of a next-generation LSI and high in productivity and reliability as well as a bump forming method are provided. After a resin 14 containing a solder powder 16 and a gas bubble generating agent is supplied to a space between a circuit board 21 having a plurality of connecting terminals 11 and a semiconductor chip 20 having a plurality of electrode terminals 12, the resin 14 is heated to generate gas bubbles 30 from the gas bubble generating agent contained in the resin 14. The resin 14 is pushed toward the outside of the generated gas bubbles 30 by the growth thereof and self-assembled between the connecting terminals 11 and the electrode terminals 12. By further heating the resin 14 and melting the solder powder 16 contained in the resin 14 self-assembled between the terminals, connectors 22 are formed between the terminals to complete a flip chip mounting body.

7 Claims, 18 Drawing Sheets

FOREIGN PATENT DOCUMENTS

| | | |
|---|---|---|
| JP | 11-186334 | 7/1999 |
| JP | 2000-094179 | 4/2000 |
| JP | 2000-332055 | 11/2000 |
| JP | 2002-026070 | 1/2002 |
| JP | 2002-329745 | 11/2002 |
| JP | 2004-260131 | 9/2004 |

OTHER PUBLICATIONS

Yasuda, Masahiro et al., "Self-Organized Joining Assembly Process by Electrically Conductive Adhesive Using Low Melting Point Fillers," 10th Symposium on "Microjoining and Assembly Technology in Electronics," Feb. 5-6, 2004, Yokohama.

Yasuda, Kiyokazu et al., "Self-Organized Packaging Using Polymer Containing Low-Melting-Point-Metal Filler-Process Simulation of Viscous Multi Phase Flow Fluid," 11th Symposium on "Microjoining and Assembly Technology in Electronics," Feb. 3-4, 2005, Yokohama.

Yamada, Takayuki et al., "Self-organized Packaging by Polymer Containing Low Melting Point Metal-Experimental-Verification of Process Rule Factors of Self-organization," 11th Symposium on "Microjoining and Assembly Technology in Electronics," Feb. 3-4, 2005, Yokohama.

\* cited by examiner (a)

| Solder Powder (Metal Particles) | Melting Temperature (Solidus Line) (°C) |
|---|---|
| Sn-58Bi | 139 |
| Sn-37Pb | 183 |
| Sn-9Zn | 199 |
| Sn-3.0Ag-0.5Cu | 217 |
| Sn-3.5Ag | 221 |
| Sn-0.7Cu | 228 |
| 12Sn-2.0Ag-10Sb-Pb | 240 |

FIG. 12

| Gas Bubble Generating Agent | Boiling Point (°C) | Gas Bubble Generating Agent | Boiling Point (°C) |
|---|---|---|---|
| hexane | 69 | dimethylamine hydrochloride | 171 |
| vinyl acetate | 72 | dimethyl sulfoxide (DMSO) | 189 |
| isopropyl alcohol | 83 | ethylene glycol | 198 |
| water | 100 | N-methyl-2-pyrrolidone(NMP) | 204 |
| 1,4-dioxane | 101 | α-terpineol | 218 |
| butyl acetate | 126 | butyl carbitol | 231 |
| propionic acid | 141 | butyl carbitol acetate | 246 |

FIG. 13

| Gas Bubble Generating Agent | Decomposition Temperature(°C) |
|---|---|
| boric acid | 70~ |
| ammonium metaborate | 120~ |
| sodium hydrogen carbonate | 120-150 |
| 4,4'-oxybis (benzene sulfonyl hydrazide) (OBSH) | 155-165 |
| azodicarbonamide (ADCA) | 197-210 |
| barium metaborate | 200~ |
| N,N'-dinitrosopentamethylenetetramine (OBSH) | 200-250 |
| aluminum hydroxide | 230 |
| calcium aluminate | 230 |
| dawsonite | 230 |

(a)

(b)

(c)

(d)

FLIP CHIP MOUNTING METHOD AND BUMP FORMING METHOD

RELATED APPLICATIONS

This application is a Divisional of U.S. application Ser. No. 11/887,332, filed Sep. 28, 2007 now U.S. Pat. No. 7,531,387, which is a U.S. National Phase under 35 U.S.C. § 371 of International Application No. PCT/JP2006/305273, filed Mar. 16, 2006, claiming priority of Japanese Application No. 2005-094232, filed Mar. 29, 2005, the entire contents of each of which are hereby incorporated by reference.

TECHNICAL FIELD

The present invention relates to a flip chip mounting method for mounting a semiconductor chip on a circuit board and to a method for forming bumps on the electrodes of a substrate.

BACKGROUND ART

In recent years, as semiconductor integrated circuits (LSIs) used in electronic equipment have become higher in density and degree of integration, the electrode terminals of LSI chips have rapidly become higher in pin count and narrower in pitch. To mount such an LSI chip on a circuit board, flip chip mounting has been used widely for a reduction in wiring delay. In the flip chip mounting, it is typical to form solder bumps on the electrode terminals of an LSI chip and simultaneously bond the electrode terminals to connecting terminals formed on a circuit board via the solder bumps.

To mount a next-generation LSI having electrode terminals the number of which is over 5,000, it is needed to form bumps corresponding to a narrower pitch of not more than 100 μm. However, with a current solder-bump forming technology, it is difficult to respond to the need. In addition, it is needed to form a large number of bumps corresponding to the number of electrode terminals. Therefore, to reduce cost, it is also required to achieve high productivity by reducing a mounting tact time per chip.

Likewise, due to an increased number of electrode terminals, the semiconductor integrated circuit has shifted from the use of peripheral electrode terminals to that of area array electrode terminals. Under the higher-density and higher-integration requirements, it is expected that the scale of a semiconductor process advances from 90 nm to 65 nm and 45 nm. As a result, the miniaturization of wiring further proceeds and a wire-to-wire capacitance increases so that problems associated with a higher speed and a power consumption loss have become serious and demand for a low-dielectric-constant (low-k) insulating film between wiring layers has further grown. Such a low-k insulating film can be implemented by porosifying an insulating layer material so that the mechanical strength thereof is low, presenting an obstacle to a reduction in the thickness of a semiconductor. Moreover, when area array electrode terminals are constructed as described above, there is a problem in the strength of a low-k porous film. Consequently, it has become difficult to form bumps on the area array electrodes and perform flip chip mounting itself. As a result, there has been demand for a low-load flip chip mounting method suitable for a higher-density thin semiconductor compatible with the future advancement of a semiconductor process.

As conventional bump forming techniques, a plating method, a screen printing method, and the like have been developed. The plating method is suitable for a narrow pitch, but has a problem in productivity because of complicated process steps. The screen printing method is excellent in productivity, but is not suitable for a narrow pitch because of the use of a mask.

In such a situation, several techniques which selectively form solder bumps on the electrodes of an LSI chip and a circuit board have been developed recently. These techniques are not only suitable for the formation of micro-bumps but also capable of simultaneously forming the bumps so that they are also excellent in productivity and draw attention as techniques applicable to the mounting of a next-generation LSI on a circuit board.

For example, the technique disclosed in Patent Document 1, Patent Document 2, or the like solidly coats a solder paste composed of a mixture of a solder powder and a flux on a substrate having electrodes formed on the surface thereof, melts the solder powder by heating the substrate, and selectively forms solder bumps on the electrodes having high wettability.

The technique disclosed in Patent Document 3 solidly coats a paste-like composition (deposition-type solder using a chemical reaction) containing an organic acid lead salt and metallic tin as main components on a substrate on which electrodes are formed, causes a substitution reaction between Pb and Sn by heating the substrate, and selectively deposits a Pb/Sn alloy on the electrodes of the substrate.

However, each of the techniques disclosed in Patent Documents 1 to 3 shown above supplies a paste-like composition onto the substrate by coating, local variations in thickness and concentration occur. Accordingly, the amount of a deposited solder differs from one electrode to another and bumps having uniform heights cannot be obtained. In addition, since each of the methods supplies the paste-like composition by coating onto the circuit board having projections and depressions formed in the surface thereof, a sufficient amount of the solder cannot be supplied onto the electrodes forming projecting portions so that it is difficult to obtain bumps of desired heights, which is necessary in flip chip mounting.

In flip chip mounting using a conventional bump forming technique, after a semiconductor chip is mounted on a circuit board on which bumps are formed, the step of injecting a resin termed an underfill into the space between the semiconductor chip and the circuit board is further needed to fix the semiconductor chip to the circuit board.

As a method for simultaneously performing the provision of electrical connection between the facing electrode terminals of the semiconductor chip and the circuit board and the fixation of the semiconductor chip to the circuit board, a flip chip mounting technique (see, e.g., Patent Document 4) using an anisotropic conductive material has been developed. The technique supplies a thermosetting resin containing conductive particles into the space between the circuit board and the semiconductor chip and heats the thermosetting resin, while simultaneously pressing the semiconductor chip, thereby simultaneously implementing the electrical connection between the respective electrode terminals of the semiconductor chip and the circuit board and the fixation of the semiconductor chip to the circuit board.

Patent Document 1: Japanese Laid-Open Patent Publication No. 2000-94179
Patent Document 2: Japanese Laid-Open Patent Publication No. HEI 6-125169
Patent Document 3: Japanese Laid-Open Patent Publication No. HEI 1-157796
Patent Document 4: Japanese Laid-Open Patent Publication No. 2000-332055

Patent Document 5: Japanese Laid-Open Patent Publication No. 2002-26070
Patent Document 6: Japanese Laid-Open Patent Publication No. HEI 11-186334
Patent Document 7: Japanese Laid-Open Patent Publication No. 2004-260131
Non-Patent Document 1: Masahito Yasuda et al., "Self-Organized Joining Assembly Process by Electrically Conductive Adhesive Using Low Melting Point Filler" 10th Symposium on "Microjoining and Assembly Technology in Electronics, pp. 183 to 188, 2004)

DISCLOSURE OF THE INVENTION

PROBLEMS TO BE SOLVED BY THE INVENTION

However, in the flip chip mounting using the anisotropic conductive material described above, electric conduction between the electrodes is obtained through mechanical contact via the conductive particles and it is difficult to obtain a stable conductive state.

Moreover, because the conductive particles interposed between the facing electrodes are maintained by cohesion resulting from the thermosetting of the resin, it is necessary to equalize the characteristics of the thermosetting resin, such as elasticity and a thermal expansion coefficient, and the characteristics of the conductive particles such as a particle size distribution, resulting in the problem of difficult process control.

Thus, to apply the flip chip mounting using the anisotropic conductive material to a next generation LSI chip having connecting terminals the number of which is over 5,000, a large number of problems remain to be solved in terms of productivity and reliability.

The present invention has been achieved in view of the foregoing and a primary object thereof is to provide a flip chip mounting method which is applicable to the flip chip mounting of a next-generation LSI and high in productivity and reliability. Another object of the present invention is to provide a bump forming method obtained by applying the technique of the flip chip mounting method according to the present invention to bump formation.

MEANS FOR SOLVING THE PROBLEMS

A flip chip mounting method of the preset invention is a flip chip mounting method for disposing a semiconductor chip having a plurality of electrode terminals in facing relation to a circuit board having a plurality of connecting terminals and electrically connecting the connecting terminals of the circuit board to the electrode terminals of the semiconductor chip, the flip chip mounting method comprising: a first step of supplying a resin containing a solder powder and a gas bubble generating agent to a space between the circuit board and the semiconductor chip; a second step of heating the resin to generate gas bubbles from the gas bubble generating agent contained in the resin; and a third step of heating the resin to melt the solder powder contained in the resin, wherein, in the second step, the resin is pushed toward the outside of the gas bubbles generated from the gas bubble generating agent by growth of the gas bubbles and self-assembled between the connecting terminals of the circuit board and the electrode terminals of the semiconductor chip and, in the third step, the solder powder contained in the resin self-assembled between the terminals is melted to form connectors between the terminals.

Preferably, the flip chip mounting method further comprises, after the third step, the step of: curing the resin between the terminals. Preferably, the heating in the second step is performed at a temperature lower than a temperature at which the heating in the third step is performed.

In a preferred embodiment, the gas bubble generating agent is composed of a material which boils when the resin is heated. In addition, a boiling temperature of the gas bubble generating agent is preferably lower than a melting temperature of the solder powder. The gas bubble generating agent may also be composed of two or more materials having different boiling temperatures.

In a preferred embodiment, the gas bubble generating agent is composed of a material which is thermally decomposed to generate the gas bubbles when the resin is heated. The gas bubble generating agent may also be composed of a compound containing water of crystallization and decomposed to generate water vapor when the resin is heated.

In a preferred embodiment, each of the second step and the third step is performed while the temperature at which the resin is heated is continuously increased.

In a preferred embodiment, the second step is performed while the space between the circuit board and the semiconductor chip is varied. Preferably, the second step is performed while the space between the circuit board and the semiconductor chip is increased.

In a preferred embodiment, the third step is performed while the space between the circuit board and the semiconductor chip is varied. Preferably, the third step is performed while the space between the circuit board and the semiconductor chip is reduced.

In a preferred embodiment, the first step is performed by supplying the resin containing the solder powder and the gas bubble generating agent onto the circuit board and then disposing the semiconductor chip on a surface of the resin.

In a preferred embodiment, the third step includes the step of melting a surface of the solder powder contained in the resin and the connectors formed in the third step are in a state in which interfaces between the solder powder particles are metallically bonded.

In a preferred embodiment, the semiconductor chip having the plurality of electrode terminals has a structure in which a semiconductor bare chip is mounted on an interposer having the plurality of electrode terminals.

In a preferred embodiment, the flip chip mounting method further comprises, after the third step, the step of: supplying an underfill material into the space between the circuit board and the semiconductor chip and then curing the underfill material.

A bump forming method of the present invention is a bump forming method for a substrate having a plurality of electrode terminals, the bump forming method comprising: a first step of disposing a flat plate in facing relation to the substrate and supplying a resin containing a solder powder and a gas bubble generating agent into a space between the flat plate and the substrate; a second step of heating the resin to generate gas bubbles from the gas bubble generating agent contained in the resin; and a third step of heating the resin to melt the solder powder contained in the resin, wherein, in the second step, the resin is pushed toward the outside of the gas bubbles generated from the gas bubble generating agent by growth of the gas bubbles and self-assembled on the electrodes of the substrate and, in the third step, the solder powder contained in the resin self-assembled on the electrodes is melted to form bumps on the electrodes.

In a preferred embodiment, the heating in the third step is performed at a temperature higher than a temperature at which the heating in the second step is performed.

In a preferred embodiment, the gas bubble generating agent is preferably composed of a material which boils when the resin is heated. In addition, a boiling temperature of the gas bubble generating agent is preferably lower than a melting temperature of the solder powder.

In a preferred embodiment, the gas bubble generating agent is composed of a material which is thermally decomposed to generate the gas bubbles when the resin is heated.

In a preferred embodiment, the second step is performed while the space between the substrate and the flat plate is varied. Preferably, the third step is performed while the space between the substrate and the flat plate is varied.

In a preferred embodiment, the first step is performed by supplying the resin containing the solder powder and the gas bubble generating agent onto the substrate and then disposing the flat plate on a surface of the resin.

In a preferred embodiment, projecting portions having generally the same shapes as the plurality of electrodes formed on the substrate are formed at positions facing the electrodes on a flat surface of the flat plate facing the substrate. Preferably, each of the projecting portions has at least a surface thereof formed of a metal.

In a preferred embodiment, the bump forming method further comprises, after the third step, the step of: removing the resin and the flat plate.

In a preferred embodiment, the third step includes the step of melting a surface of the solder powder contained in the resin and the bumps formed in the third step are in a state in which interfaces between the solder powder particles is metallically bonded.

A flip chip mounting body of the present invention is a flip chip mounting body comprising a circuit board having a plurality of connecting terminals and a semiconductor chip having a plurality of electrode terminals and disposed in facing relation to the circuit board such that the connecting terminals of the circuit board are electrically connected to the electrode terminals of the semiconductor chip, wherein the connecting terminals are electrically connected to the electrode terminals via connectors formed therebetween by supplying a resin containing a solder powder and a gas bubble generating agent into a space between the circuit board and the semiconductor chip, causing the resin to be self-assembled between the connecting terminals and the electrode terminals, and melting the solder powder in the self-assembled resin.

In a preferred embodiment, the circuit board is composed of an interposer having a plurality of external terminals, the flip chip mounting body having a structure as a CSP or a BGA in which the semiconductor chip is mounted on the interposer.

Preferably, the flip chip mounting body is fixed with a resin supplied into the space between the circuit board and the semiconductor chip.

A flip chip mounting apparatus of the present invention is a flip chip mounting apparatus for flip chip mounting a semiconductor chip on a circuit board, the flip chip mounting apparatus comprising: holding means for holding the semiconductor chip and the circuit board in mutually facing relation with a given space provided therebetween; supplying means for supplying a resin containing a solder powder and a gas bubble generating agent into the space between the semiconductor chip and the circuit board; and heating means for heating the resin, wherein the heating means has first heating means for controlling a temperature to a value at which gas bubbles are from the gas bubble generating agent contained in the resin and second heating means for controlling the temperature to a value at which the solder powder contained in the resin is melted.

In a preferred embodiment, the resin heated with the first heating means is pushed toward the outside of the gas bubbles generated from the gas bubble generating agent by growth of the gas bubbles and self-assembled between connecting terminals of the circuit board and electrode terminals of the semiconductor chip and connectors are formed between the terminals by melting the solder powder contained in the resin self-assembled between the terminals with the second heating means.

A bump forming apparatus of the present invention is a bump forming apparatus for forming bumps on a plurality of electrodes formed on a substrate, the bump forming apparatus comprising: holding means for holding a flat plate at a position facing the substrate with a given space provided therebetween; supplying means for supplying a resin containing a solder powder and a gas bubble generating agent into the space between the substrate and the flat plate; and heating means for heating the resin, wherein the heating means has first heating means for controlling a temperature to a value at which gas bubbles are generated from the gas bubble generating agent contained in the resin and second heating means for controlling the temperature to a value at which the solder powder contained in the resin is melt.

In a preferred embodiment, the resin heated with the first heating means is pushed toward the outside of the gas bubbles generated from the gas bubble generating agent by growth of the gas bubbles and self-assembled on the electrodes of the substrate and the bumps are formed on the electrodes by melting the solder power contained in the resin self-assembled on the electrode with the second heating means.

EFFECT OF THE INVENTION

In the flip chip mounting method according to the present invention, by heating the resin containing the solder powder and the gas bubble generating agent which is supplied into the space between the circuit board and the semiconductor chip, the gas bubbles are generated from the gas bubble generating agent and the resin is pushed toward the outside of the gas bubbles by the growth thereof and allowed to be self-assembled between the connecting terminals of the circuit board and the electrode terminals of the semiconductor chip. Then, by melting the solder powder contained in the resin self-assembled between the terminals, the connectors made of the molten solder powder can be formed by self alignment between the terminals having high wettability. As a result, it is possible to cause efficient self-assembly of the solder powder dispersed in the resin between the terminals and implement a flip chip mounting body with excellent uniformity and high productivity.

After forming the connectors between the terminals by the method described above, by further curing the resin remaining in the space between the circuit board and the semiconductor chip, the semiconductor chip can be fixed to the circuit board. Accordingly, it is possible to simultaneously perform the provision of the electrical connection between respective terminals of the semiconductor chip and the circuit board and the fixation of the semiconductor chip to the circuit board in a sequence of steps. As a result, a flip chip mounting body having higher productivity can be implemented.

Likewise, in the bump forming method according to the present invention also, by allowing the growth of the gas bubbles generated from the gas bubble generating agent contained in the resin supplied into the space between the substrate and the flat plate, the resin is self-assembled on the electrodes of the substrate and, by melting the solder powder contained in the resin, the bumps made of the molten solder powder can be formed on the electrodes. This allows efficient self-assembly of the solder powder dispersed in the resin and the formation of the bumps with excellent uniformity and high productivity.

BRIEF DESCRIPTION OF THE DRAWINGS

FIG. 11 is a view showing the materials of a solder powder in the present invention;

FIG. 12 is a view showing the materials of a gas bubble generating agent in the present invention;

FIG. 13 is a view showing the materials of another gas bubble generating agent in the present invention;

DESCRIPTION OF NUMERALS

11 Connecting Terminal
12 Electrode Terminal
13, 14 Resins
15 Convection Additive
16 Solder Powder
17 Molten Solder Powder
18 Connector
19 Bump
20 Semiconductor Chip
21 Interposer
21 Circuit Board
22 Connector
30,30a,30b Gas bubbles
31 Substrate
32 Electrode
35 Underfill Material
40 Flat Plate
41 Projecting Portion
42 Metal
45 External Terminal
50 Flip Chip Mounting Apparatus (Bump Forming Apparatus)
51 Holding Means
52 Supplying Means
53 Heating Means
54 First Heating Means
55 Second Heating Means
100 Flip chip Mounting Body

BEST MODE FOR CARRYING OUT THE INVENTION

The present applicant has examined flip chip mounting applicable to a next-generation LSI chip and proposed a flip chip mounting method which is applicable to a next-generation LSI and high in uniformity and reliability in the specification of Japanese Patent Application No. 2004-267919.

Figure 1:
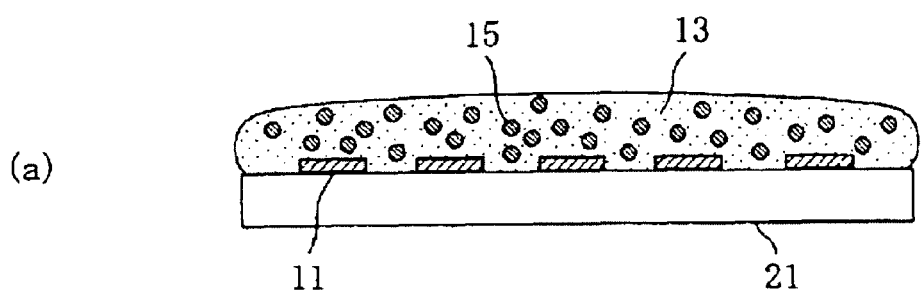
FIGS. 1(a) to 1(c) are step-by-step cross-sectional views showing a flip chip mounting method using a resin containing a convection additive.
Figure 1:
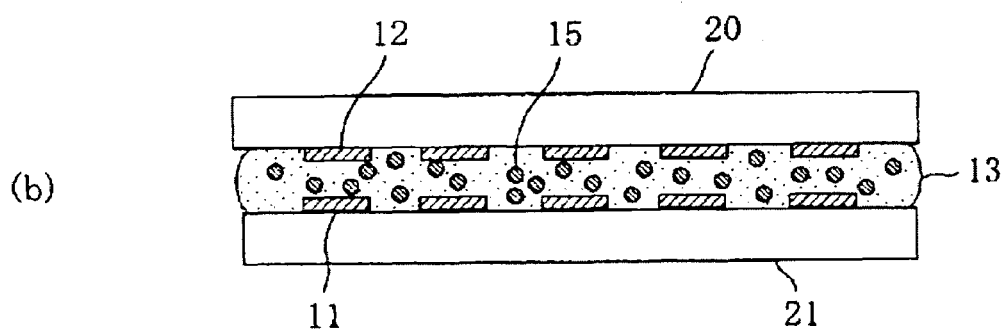
Figure 1:
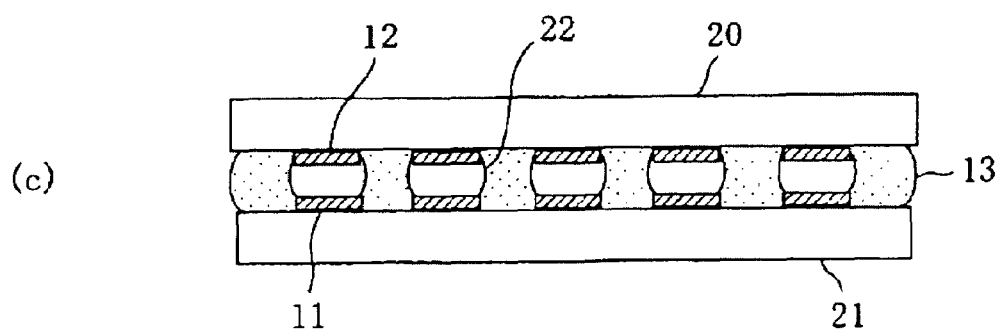

FIGS. 1(a) to 1(c) are views showing the basic process steps of the flip chip mounting method disclosed in the specification of the foregoing patent application by the present applicant.

First, as shown in FIG. 1(a), a melt resin 13 containing a solder powder (not shown) and a predetermined additive 15 is supplied onto a circuit board 21 on which a plurality of connecting terminals 11 are formed.

Next, as shown in FIG. 1(b), the surface of the resin 13 supplied onto the circuit board 21 is brought into contact with a semiconductor chip 20. At this time, the semiconductor chip 20 having a plurality of electrode terminals 12 is disposed to face the circuit board 21 having the plurality of connecting terminals 11. In this state, the melt resin 13 is heated so that the solder powder dispersed in the resin 13 is melted.

As shown in FIG. 1(c), the powder particles of the molten solder are bonded to each other in the molten resin 13 and self-assembled between the connecting terminals 11 and the electrode terminals 12, each having high wettability, to form connectors 22. Finally, the resin 13 is cured to fix the semiconductor chip 20 to the circuit board 21, whereby a flip chip mounting body is completed.

The characteristic feature of the method is that the additive 15 which boils at a temperature at which the solder powder is melted is further contained in the resin 13 containing the solder powder. That is, the additive 15 (hereinafter referred to as a convection additive) contained in the resin 13 boils at the temperature at which the solder powder is melted and, by the convection of the boiling convection additive 15 in the molten resin 15, the movement of the molten solder powder dispersed in the resin is accelerated to promote uniform bonding of the powder particles of the molten solder. As a result, the molten solder powder that has uniformly grown is self-assembled between the connecting terminals 11 of the circuit board 21 and the electrode terminals 12 of the semiconductor chip 20, each having high wettability. This allows the formation of the highly uniform connectors 22 between the connecting terminals 11 and the electrode terminals 12.

It can be considered herein that the melt resin 13 containing the solder powder functions as a "sea" in which the molten solder power can freely flow and move. However, since the bonding process of the powder particles of the molten solder is completed within an extremely short period of time (typically 5 to 10 seconds), even when the "sea" in which the molten solder powder can move is provided, the movement ends up proceeding only locally and uniform bonding cannot be obtained between the powder particles of the molten solder.

Thus, the method described above has intended to add means for forcibly moving the molten solder powder (convective effect) by causing the melt resin 13 containing the solder powder to further contain the convection additive 15.

From the same technical viewpoint as mentioned above, the present invention proposes a novel flip chip mounting method which causes efficient self-assembly of the molten solder powder between the terminals in a manner different from the above and allows the formation of uniform connectors.

The present invention also proposes a bump forming method which causes efficient self-assembly of the molten solder powder on the electrodes of a substrate by applying the novel flip chip mounting method to a bump forming method and thereby allows the formation of uniform bumps.

Referring to the drawings, the embodiments of the present invention will be described herein below. For easier illustration, components having substantially the same functions are designated by the same reference numerals in the drawings shown below. The present invention is not limited to the following embodiments.

Embodiment 1

FIGS. 2(a) to 2(d) and FIGS. 3(a) to 3(c) are step-by-step cross-sectional views showing the basic process steps of a flip chip mounting method in the first embodiment of the present invention.

Figure 2:
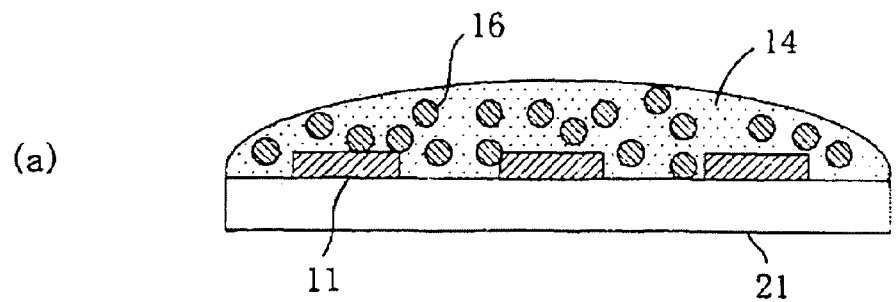
FIGS. 2(a) to 2(d) are step-by-step cross-sectional views showing a flip chip mounting method in a first embodiment of the present invention.
Figure 2:
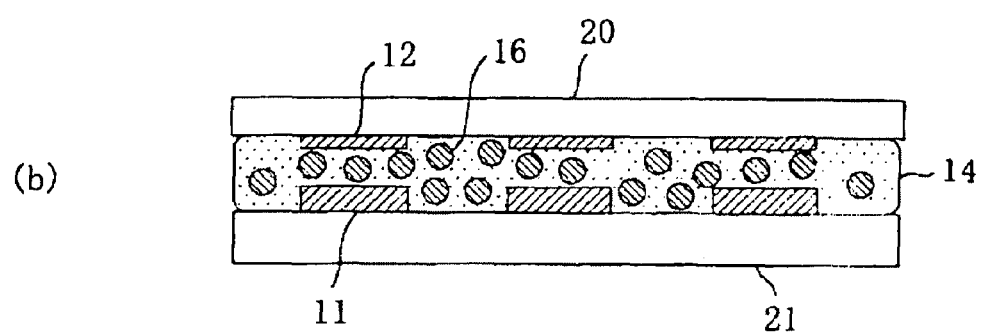
Figure 2:
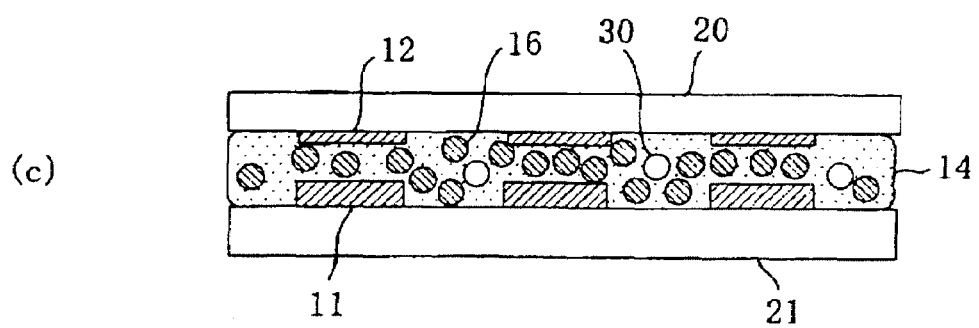
Figure 2:
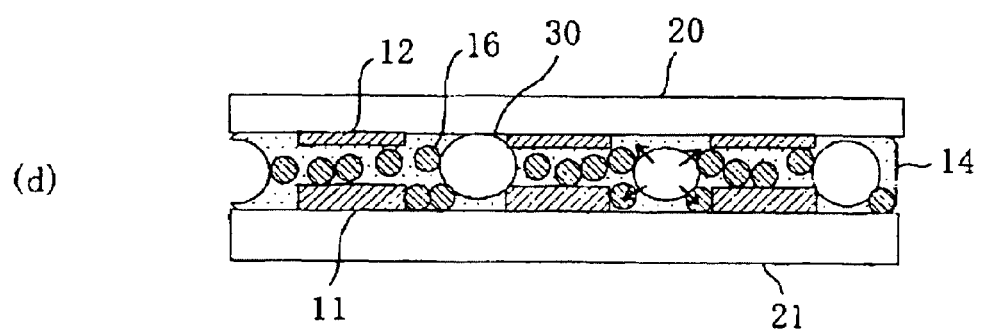

First, as shown in FIG. 2(a), a resin (e.g., an epoxy resin or the like) 14 containing a solder power (e.g., a Sn—Ag solder or the like) 16 and a gas bubble generating agent (e.g., isopropyl alcohol or the like) is supplied onto the circuit board 21 having the plurality of connecting terminals 11. Then, as shown in FIG. 2(b), the semiconductor chip 20 having the plurality of electrode terminals 12 is disposed on the surface of the resin 14 to face the circuit board 21. At this time, the electrode terminals 12 of the semiconductor chip 20 are aligned with respect to the connecting terminals 11 of the circuit board 21.

The steps shown herein may also be such that the circuit board 21 and the semiconductor chip 20 are preliminarily disposed to face each other with a given space (e.g., 10 to 80 µm) interposed therebetween and then the resin 14 containing the solder powder and the gas bubble generating agent is supplied into the space.

In this state, when the resin 14 is heated to a predetermined temperature (e.g., 100 to 150° C.), gas bubbles 30 are generated from the gas bubble generating agent contained in the resin 14, as shown in FIG. 2(c). Then, as shown in FIG. 2(d), the resin 14 is pushed toward the outside of the generated gas bubbles 30 by the growth thereof.

Figure 3:
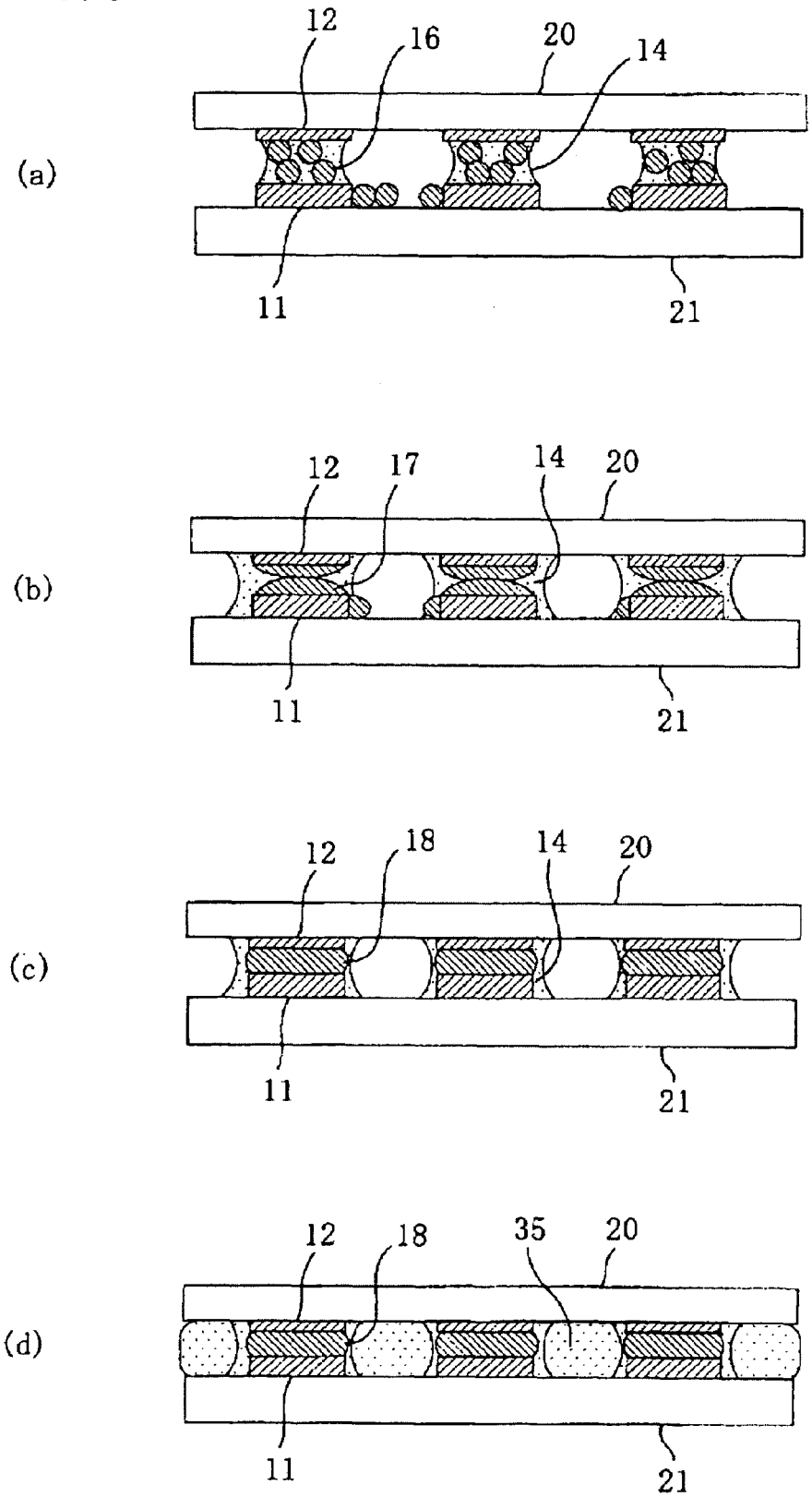
FIGS. 3(a) to 3(d) are step-by-step cross-sectional views showing the flip chip mounting method in the first embodiment.

As shown in FIG. 3(a), the resin 14 pushed to the outside is self-assembled in the form of columns (e.g., generally cylindrical columns) at the interfaces with the connecting terminals 11 of the circuit board 21 and at the interfaces with the electrode terminals 12 of the semiconductor chip 20. Then, when the resin 14 is further heated, the solder powder 16 contained in the resin 14 melts and the molten solder powder particles 16 contained in the resin 14 self-assembled between the terminals are melt-bonded to each other, as shown in FIG. 3(b). Each of the connecting terminals 11 and the electrode terminals 12 has high wettability with respect to the melt-bonded solder powder 17 so that connectors 18 made of the molten solder powder are formed between the terminals, as shown in FIG. 3(c). As a result, a flip chip mounting body 100 in which the semiconductor chip is mounted on the circuit board is obtained.

After the connectors 18 are formed between the terminals, the resin 14 remaining between the terminals is subsequently cured to allow the semiconductor chip 20 to be fixed to the circuit board 21, as shown in FIG. 3(c).

As necessary, an underfill material 35 may also be injected into the space between the semiconductor chip 20 and the circuit board 21 and then cured to more firmly fix the semiconductor chip 20 to the circuit board 21.

In accordance with the present invention, by heating the resin 14 containing the solder powder 16 and the gas bubble generating agent which is supplied into the space between the circuit board 21 and the semiconductor chip 20, the gas bubbles 30 are generated from the gas bubble generating agent and, by allowing the gas bubbles 30 to grow and push the resin 14 toward the outside thereof, the resin 14 can be self-assembled between the connecting terminals 11 of the circuit board 21 and the electrode terminals 12 of the semiconductor chip 20. By melting the solder powder 16 contained in the resin 14 self-assembled between the terminals, the connectors 22 made of the molten solder powder can be formed by self alignment between the terminals having high wettability. This allows efficient self-assembly of the solder powder 16 dispersed in the resin 14 between the terminals and the flip chip mounting body 100 with excellent uniformity and high productivity to be implemented.

Moreover, after the connectors 22 are formed between the terminals by the method described above, the semiconductor chip 20 can be fixed to the circuit board 21 by curing the resin 14 remaining in the space between the circuit board 21 and the semiconductor chip 20. As a result, it is possible to simultaneously perform the provision of electrical connection between the respective terminals of the semiconductor chip 20 and the circuit board 21 and the fixation of the semiconductor chip 20 to the circuit board 21 in a sequence of steps and implement the flip chip mounting body 100 with higher productivity.

The sizes of the individual components and the positional relationships therebetween shown in FIGS. 2(a) to 2(d) and FIGS. 3(a) to 3(d) (e.g., the sizes of the solder powder particles 16, the size of the spacing between the circuit board 21 and the semiconductor chip 20, and the like) are represented for the convenience of easier illustration and do not show real sizes and the like.

Figure 4:
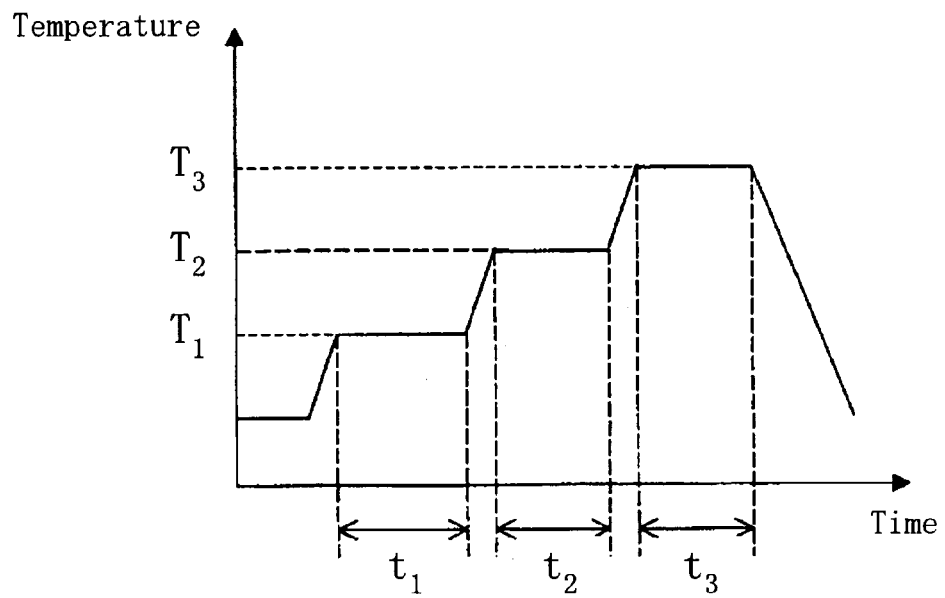
FIG. 4 is view showing a temperature profile in heating a resin in the present invention.

FIG. 4 is a graph showing an example of a temperature profile in the step of heating the resin 14 in the flip chip mounting method described above, in which the abscissa axis represents a time during which the resin 14 is heated and an ordinate axis represents a temperature at which the resin 14 is heated.

As shown in FIG. 4, the resin 14 is first heated to a temperature $T_1$ at which the gas bubbles 30 are generated from the gas bubble generating agent contained in the resin 14. The temperature $T_1$ is held for a given time $t_1$, during which the generated gas bubbles 30 grow to push the resin 14 toward the outside thereof and the resin 14 is self-assembled in the form of columns between the terminals. The temperature $T_1$ is set herein to, e.g., 100 to 180° C. and the given time $t_1$ is set to, e.g., about 5 to 10 seconds.

Next, the resin 14 is heated to a temperature $T_2$ at which the solder powder 16 contained in the resin 14 melts. The temperature $T_2$ is held for a given time $t_2$, during which the solder powder particles 16 contained in the resin 14 self-assembled between the terminals are melt-bonded to form the connectors 18 between the terminals having high wettability. Finally, the resin 14 is heated to a temperature $T_3$ at which the resin 14 is cured. The temperature $T_3$ is held for a given time $t_3$ to cure the resin 14 remaining between the terminals and thereby fix the semiconductor chip 20 to the circuit board 21.

The temperature $T_2$ is set herein to, e.g., 150 to 250° C. and the given time $t_2$ is set to, e.g., about 5 to 15 seconds. The temperature $T_3$ is set herein to, e.g., 150 to 250° C. and the given time $t_3$ is set to, e.g., about 10 to 20 seconds.

In the flip chip mounting method of the present invention, it is necessary to cause the self-assembly of the resin containing the solder powder between the terminals before the solder powder melts. Accordingly, the temperature $T_1$ at which the gas bubbles are generated from the gas bubble generating agent contained in the resin should be set higher than the temperature $T_2$ at which the solder powder is melted. In other words, when the gas bubble generating agent boils to generate the gas bubbles, the boiling temperature of the gas bubble generating agent is required to be lower than the melting temperature of the solder powder.

Figure 5:
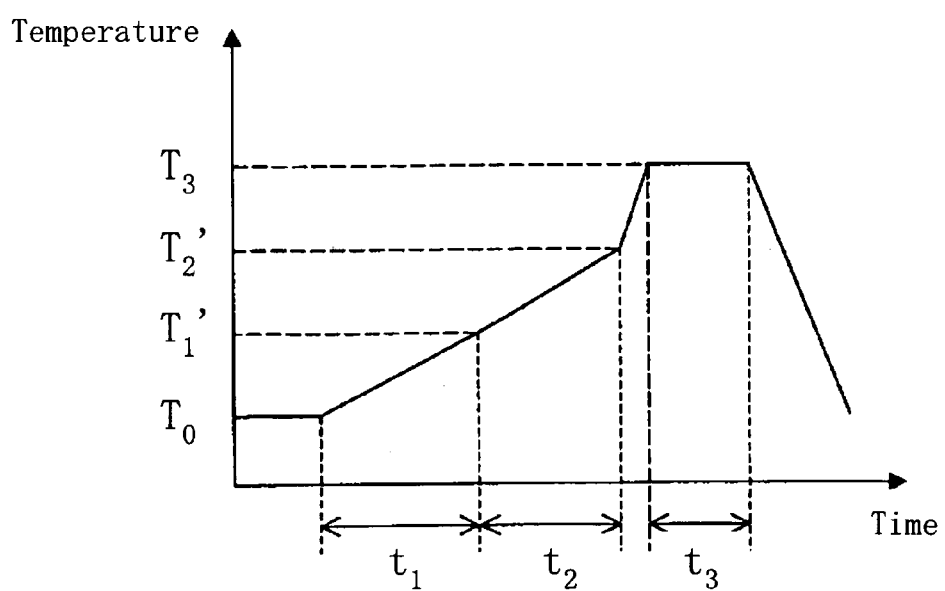
FIG. 5 is view showing another temperature profile in heating the resin in the present invention.

FIG. 5 is a graph showing another example of a temperature profile in the step of heating the resin 14 which satisfies such a relationship between the temperatures $T_1$ and $T_2$. As shown in FIG. 5, the temperature for heating the resin 14 is continuously increased from, e.g., a room temperature $T_0$. By causing the gas bubble generating agent contained in the resin 14 to generate the gas bubbles within the time $t_1$ during which the temperature for heating the resin 14 is increased from $T_0$ to $T_1$ and melting the solder powder contained in the resin 14 within the time $t_2$ during which the heating temperature is increased from $T_1$ to $T_2$, the flip chip mounting method in the present invention can be implemented. After the connectors 18 are formed between the terminals, the temperature for heating the resin 14 is increased to $T_3$ to allow the resin 14 remaining between the terminals to be cured and allow the semiconductor chip 20 to be fixed to the circuit board 21.

Figure 6:
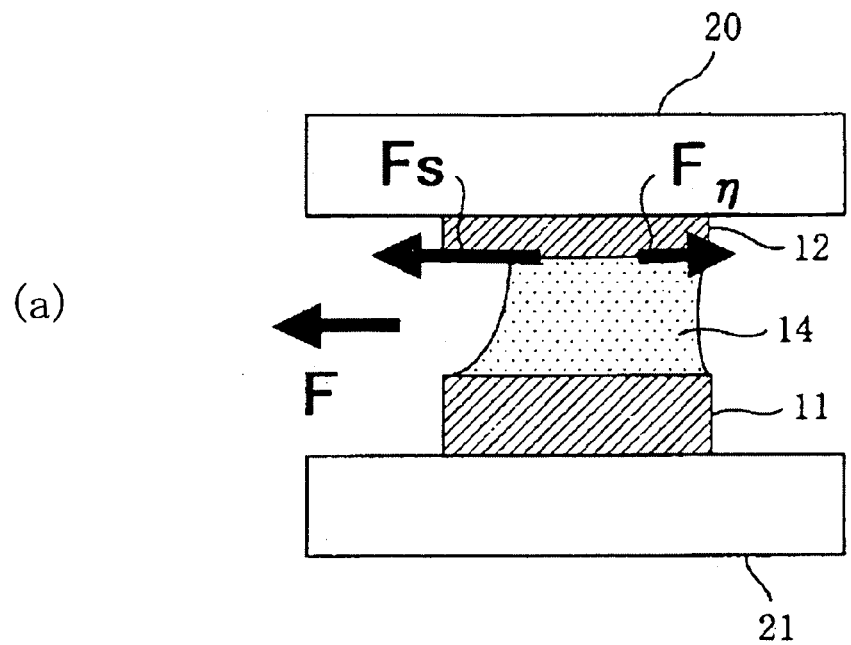
FIGS. 6(a) and 6(b) are views illustrating the self-assembly of a resin in the present invention.
Figure 6:
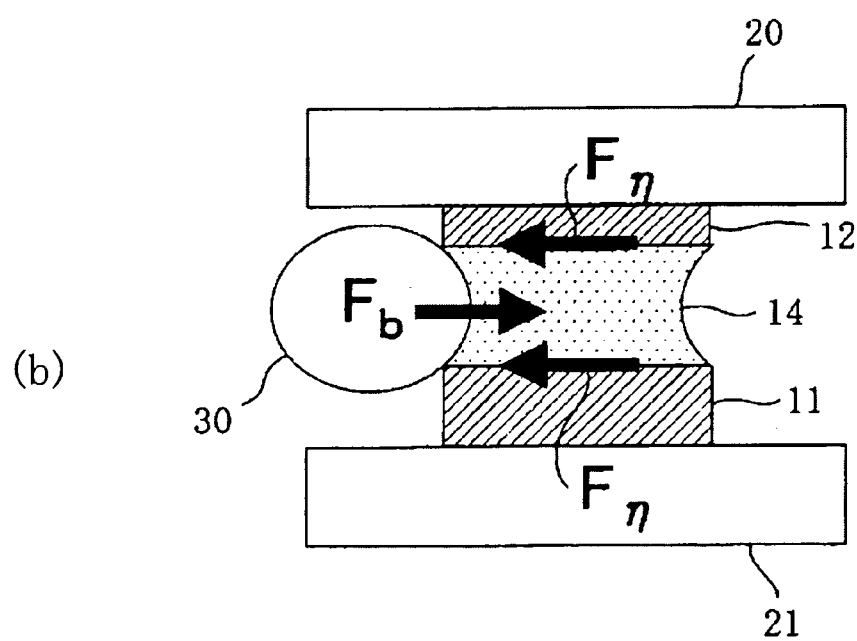

Referring to FIGS. 6(a) and 6(b), the mechanism of the self-assembly of the resin 14 between the terminals, which is a key point to the flip chip mounting method of the present invention, will be briefly described herein.

FIG. 6(a) is a view showing the state of the resin 14 pushed by the grown gas bubbles (not shown) into the space between one of the connecting terminals 11 of the circuit board 21 and the corresponding electrode terminal 12 of the semiconductor chip 20. The resin 14 that has come in contact with the connecting terminals 11 and the electrode terminals 12 has an interfacial tension (a force resulting from the so-called wet-spreading of a resin) $F_s$ at the interfaces thereof which is larger than a stress $F_\eta$ generated from the viscosity η of the resin so that the resin 14 spreads over the entire surfaces of the connecting terminal 11 and the electrode terminal 12 to finally form a columnar resin having boundaries at the end portions of the terminals 11 and 12. Accordingly, even when the positions at which the connecting terminal 11 and the electrode terminal 12 face to each other are slightly displaced, the resin 14 can be reliably self-assembled between the terminals under the interfacial tension.

As shown in FIG. 6(b), a stress $F_b$ resulting from the growth (or movement) of the gas bubbles 30 is applied to the columnar resin 14 formed by self-assembly between the terminals. However, the columnar resin 14 can retain the shape thereof under the effect of a reverse stress $F_\eta$ resulting from the viscosity η of the resin 14 so that the resin 14 once self-assembled does not disappear. In addition, a surface tension (or a gas-liquid interfacial tension) acts on the boundary between the resin 14 and a gas (e.g., gas bubbles 30) and the surface tension can also act to retain the shape of the columnar resin 14.

As described above, in the flip chip mounting method of the present invention, the growth of the gas bubbles generated from the gas bubble generating agent operates to cause the self-assembly of the resin between the terminals. To further enhance the operation and effect thereof, it is effective in varying the space (gap) between the circuit board 21 and the semiconductor chip 20 in the step of heating the resin, which will be described herein below with reference to FIGS. 7 to 9.

FIGS. 7(a) to 7(c) are views showing an example in which the gap between the circuit board 21 and the semiconductor chip 20 is varied in the step of generating the gas bubbles from the gas bubble generating agent contained in the resin 14 in the step of heating the resin 14 and causing the resin 14 to be self-assembled between the terminals by the growth of the gas bubbles.

FIG. 7(a) shows the state in which the resin 14 containing the solder powder 16 and the gas bubble generating agent (not shown) is supplied into the space between the circuit board 21 and the semiconductor chip 20. At this time, the gap $L_1$ between the circuit board 21 and the semiconductor chip 20 is small.

From this state, the resin 14 is heated, while the gap $L_2$ between the circuit board 21 and the semiconductor chip 20 is increased, as shown in FIG. 7(b). In the heating step, the gas bubbles 30 generated from the gas bubble generating agent gradually grow and, in the growing process, the gap $L_2$ between the circuit board 21 and the semiconductor chip 20 is also gradually increased. This allows a given amount of the resin 14 initially supplied into the space between the circuit board 21 and the semiconductor chip 20 to be efficiently self-assembled between the terminals 11 and 12. In this example, the heating step is performed, while the gap $L_3$ is gradually increased, until the resin 14 is finally self-assembled between the terminals 11 and 12 (FIG. 7(c)).

FIGS. 8(a) to 8(c) are views showing an example in which the gap between the circuit board 21 and the semiconductor chip 20 is varied in the step of melting the solder powder 16 contained in the resin 14 self-assembled between the terminals in the step of heating the resin 14 and forming the connectors 18 between the terminals.

FIG. 8(a) shows the state of the resin 14 self-assembled between the terminals 11 and 12. The gap $L_3$ between the circuit board 21 and the semiconductor chip 20 is the same as the gap shown in FIG. 7(c). In this state, the solder powder 16 is present at a given ratio in the resin 14 between the terminals. However, when the solder powder 16 is melted to form the connectors 18 between the terminals, while the gap $L_3$ is maintained, a case may also be considered where sufficient electrical connection cannot be provided between the terminals.

In melting the solder powder 16 from this state and forming the connectors 18 between the terminals, when the step of heating the resin 14 is performed, while the gap $L_4$ between the circuit board 21 and the semiconductor chip 20 is gradually reduced, the gap $L_4$ is gradually reduced in the melting process of the solder powder 16, as shown in FIG. 8(b). Finally, when the connectors 18 are formed between the terminals with the gap $L_5$ as shown in FIG. 8(c), they can be formed with a sufficient area between the terminals. This allows sufficient electrical connection to be provided between the terminals.

Even after the solder power 16 is melted, the gap between the circuit board 21 and the semiconductor chip 20 may also be varied, as shown in FIGS. 9(a) and 9(b). As shown in FIG. 9(a), connectors 18a formed between the terminals in the state with the small gap $L_1$ have the side surfaces thereof small in surface area so that the rate at which the molten solder powder (not shown) present around the connectors 18a are captured is low. However, in the state with the large gap $L_2$, connectors 18b are temporarily thinned but the surface area of the side surfaces thereof is increased, as shown in FIG. 9(b), so that the rate at which the molten solder powder present around the connectors 18b is captured becomes higher. As a result, the connectors 18b grow laterally to be formed with a sufficient area between the terminals. This allows sufficient electrical connection to be provided between the terminals.

There may be a case where small voids are formed in the connectors 18 formed between the terminals. In that case also, the voids formed in the connectors 18 can be removed by reducing the gap between the circuit board 21 and the semiconductor chip 20.

Even when there are variations in the sizes of the connectors 18 formed between the terminals, the heights of the connectors 18 can be equalized by reducing the gap between the circuit board 21 and the semiconductor chip 20. This allows more uniform electrical connection to be provided between the terminals.

Figure 7:
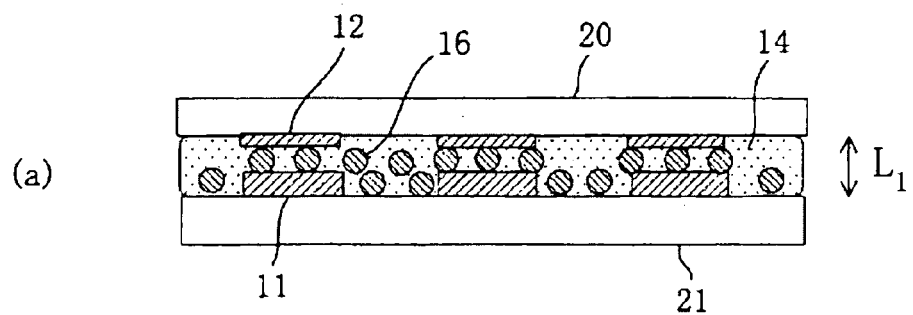
FIGS. 7(a) to 7(c) are step-by-step cross-sectional views illustrating a step of varying a gap between a circuit board and a semiconductor chip in the present invention.
Figure 7:
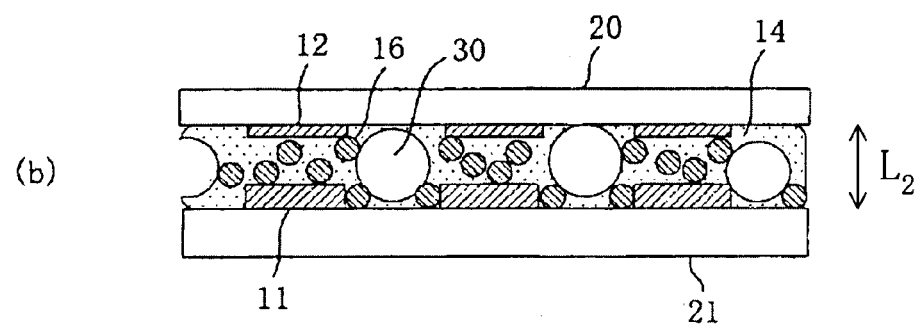
Figure 7:
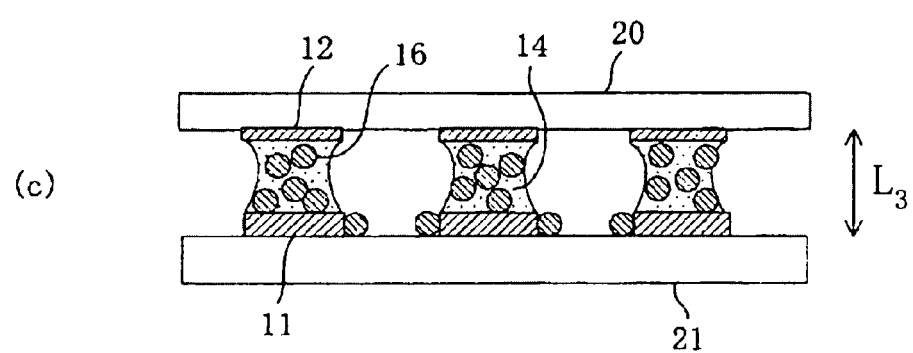
Figure 8:
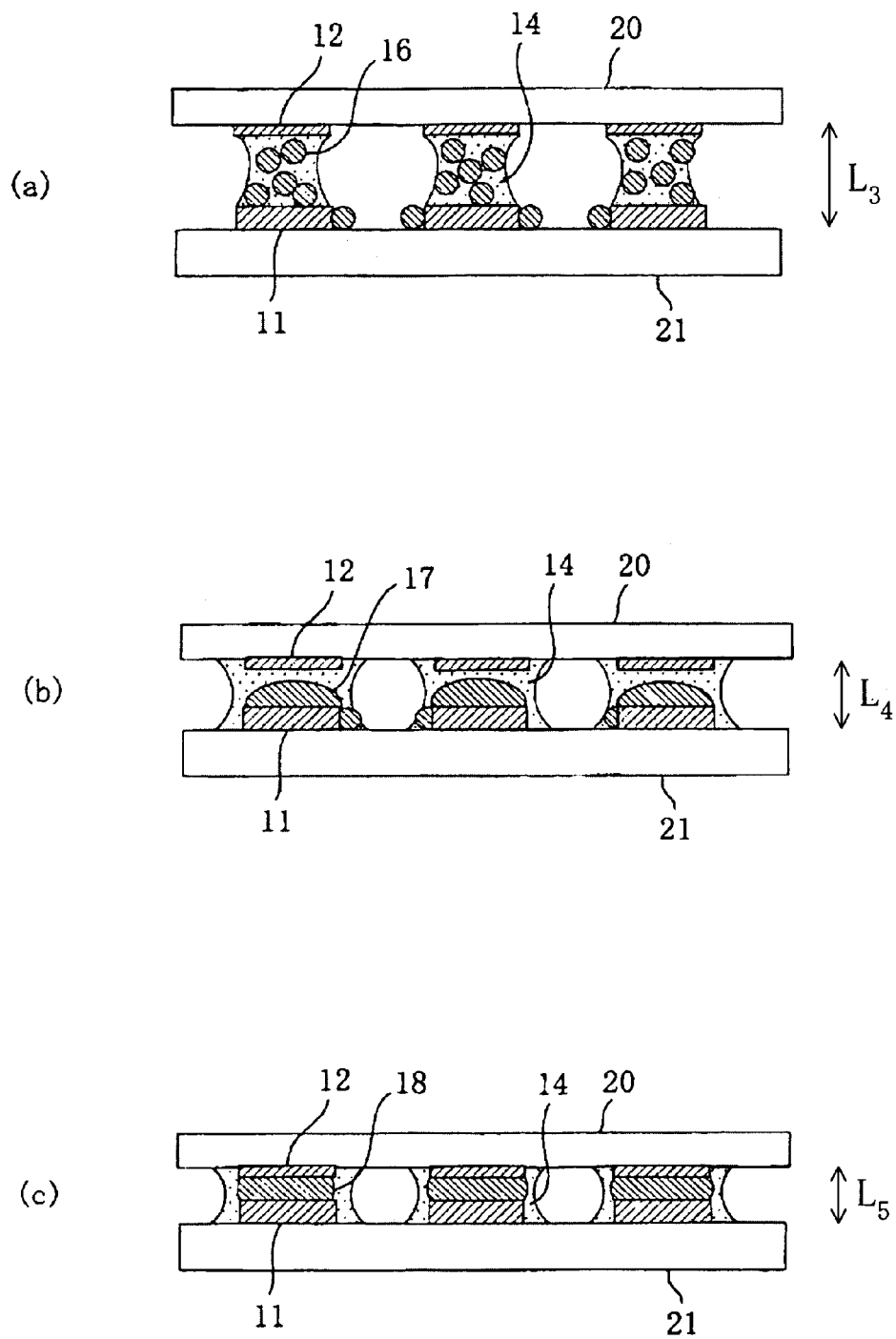
FIGS. 8(a) to 8(c) are step-by-step cross-sectional views illustrating the step of varying the gap between the circuit board and the semiconductor chip in the present invention.
Figure 9:
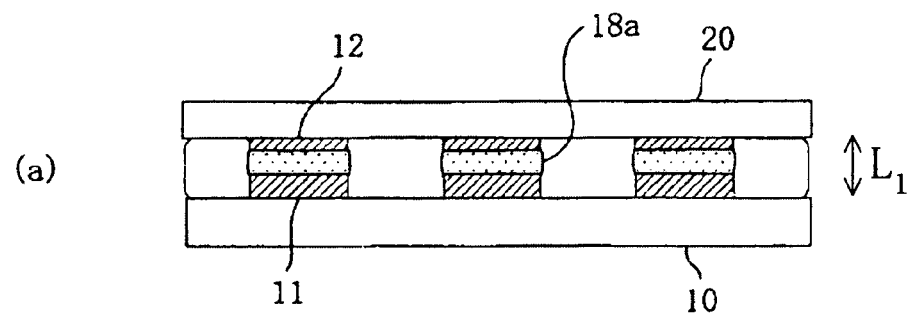
FIGS. 9(a) and 9(b) are step-by-step cross-sectional views illustrating the step of varying the gap between the circuit board and the semiconductor chip in the present invention.

Although the description has been given to the example in which the gap between the circuit board 21 and the semiconductor chip 20 is varied in the fixed direction, i.e., increased or reduced in FIGS. 7 to 9, the same operation and effect can be obtained even when the heating step is performed while periodically varying the gap.

A characteristic feature of the flip chip mounting method of the present invention is that the gas bubbles are generated from the gas bubble generating agent contained in the resin to grow and cause the resin to be self-assembled between the terminals. Although the gas bubble generating agent used in the example shown in FIGS. 2(a) to 2(c) and FIGS. 3(a) to 3(d) is made of one material, the gas bubble generating agent may also be made of two or more materials having, e.g., different boiling temperatures.

Figure 10:
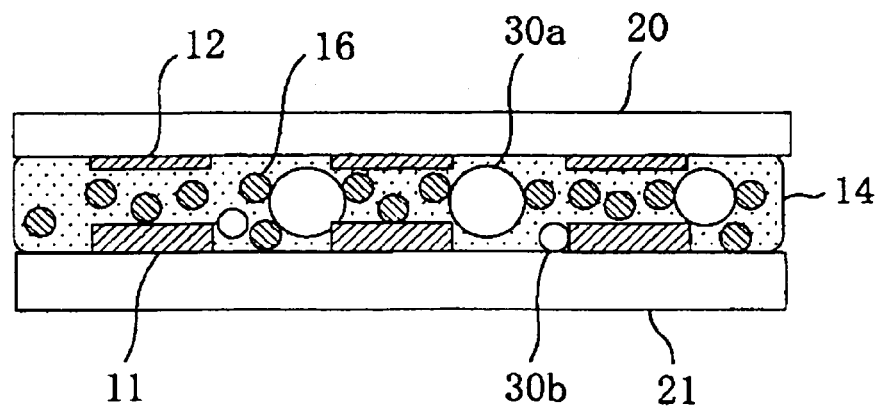
FIG. 10 is a view illustrating the self-assembly of a resin containing two or more gas bubble generating agents in the present invention.

FIG. 10 is a view showing an example in which two gas bubble generating agents having different boiling temperatures are contained in the resin 14, which shows the state of the gas bubbles generated from the gas bubble generating agents. Gas bubbles 30a generated from the gas bubble generating agent having a lower boiling temperature are larger than gas bubbles 30b generated from the gas bubble generating agent having a higher boiling temperature because the growth of the gas bubbles 30a is temporally leading that of the gas bubbles 30b.

The growing gas bubbles 30b push the resin 14 toward the outside thereof under the growing pressure thereof and can move a part of the resin 14 into the space between the connecting terminals 11 of the circuit board 21 and the electrode terminals 12 of the semiconductor chip 20, while there is also the resin 14 left behind. By repeating the operation of causing the gas bubbles 30b, which are retarded in growth, to push the resin 14 left behind again toward the outside thereof, the resin 14 can be efficiently moved into the space between the terminals. This allows uniform self-assembly of the resin 14 between the terminals and thereby allows the formation of the connectors with excellent uniformity between the terminals.

The resin 14, the solder powder 16, and the gas bubble generating agent used in the flip chip mounting method of the present invention are not particularly limited, but the following materials can be used respectively therefor.

As the resin 14, there can be used a thermosetting resin such as an epoxy resin, a phenol resin, or a silicone resin, a thermoplastic resin, a UV setting resin, or a material obtained by combining the resins shown above. However, the resin preferably has a viscosity on the order which at least allows the resin 14 to flow in the heating step. The resin 14 may also be in the form of a paste or a sheet. To further enhance the wettability of the solder powder 16, it is also possible to disperse a flux in the resin 14 or use a reducing resin serving as a flux.

The materials shown in FIGS. 11 and 12 can be used appropriately in combinations as the solder powder 16 and the gas bubble generating agent. In combinations, it is necessary for the boiling temperature of the gas bubble generating agent to be lower than the melting temperature of the solder powder. The content of the solder powder 16 in the resin 14 is preferably in the range of, e.g., about 0.5% to 30% by volume. The content of the gas bubble generating agent in the resin 14 is preferably in the range of 0.1% to 20% by weight.

As the gas bubble generating agent, a material which is thermally decomposed to generate gas bubbles (a gas such as $H_2O$, $CO_2$, or $N_2$) when the resin is heated can also be used, besides the materials shown in FIG. 12. As such a gas bubble generating agent, any of the materials shown in FIG. 13 can be used. In the case of using, e.g., a compound containing water of crystallization (aluminum hydroxide), the compound is thermally decomposed when the resin is heated and water vapor is generated as gas bubbles. In selecting the material, the decomposition temperature, not the boiling temperature, serves as a standard.

Figure 14:
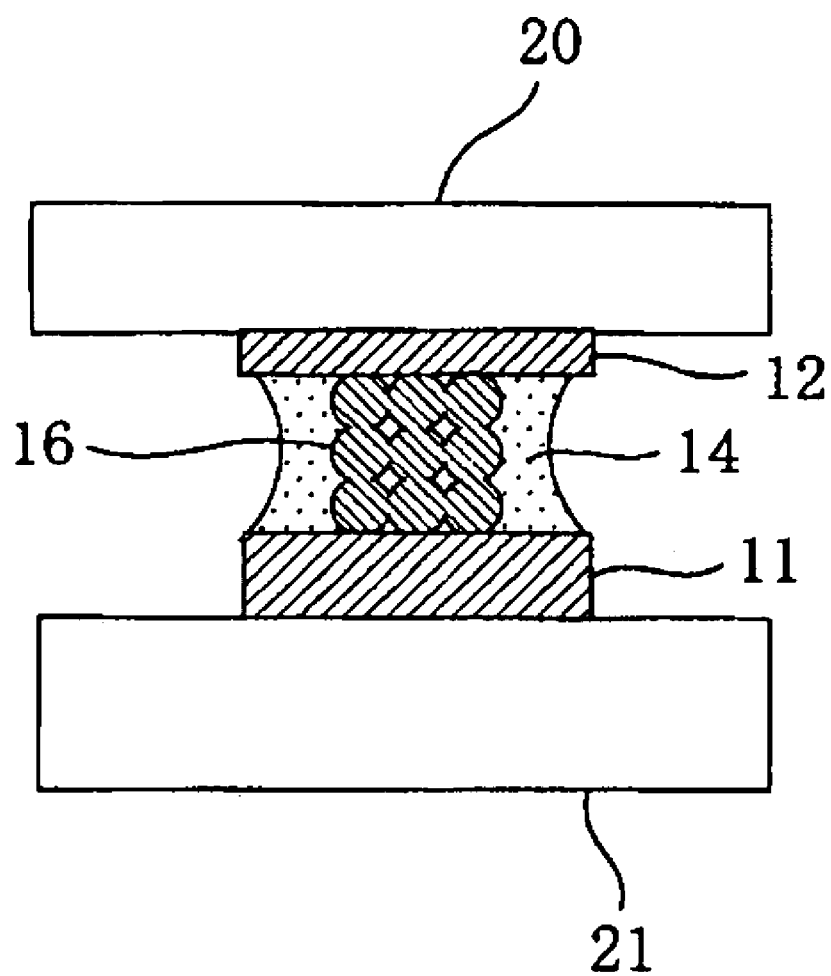
FIG. 14 is a view showing a structure of a connector in the present invention.

In the example shown in FIGS. 3(a) to 3(d), the connectors 18 are formed by melting the solder powder 16 contained in the resin 14 self-assembled between the terminals. However, the object of the present invention is attainable even though the entire solder powder 16 is not necessarily melted and only the surface of the solder powder 16 is melted so that the interfaces between the individual solder powder particles are in a metallically bonded state, as shown in FIG. 14. For example, when Cu having a surface plated with Sn is used as the solder powder, the individual solder powder particles come in contact with each other and Sn at the surfaces thereof is melted to form the connectors 18 in which the interfaces between the solder powder particles are bonded with SnCu.

The semiconductor chip 20 includes a semiconductor bare chip mounted on an interposer having a plurality of electrode terminals (lands) and flip chip mounted on the circuit board 21.

Embodiment 2

The flip chip mounting method described in the first embodiment is characterized in that the gas bubbles are generated from the gas bubble generating agent contained in the resin to grow and cause the resin to be self-assembled between the terminals and, by further melting the solder powder contained in the resin, the connectors are formed by self alignment between the terminals. This technique is also applicable to a bump forming method.

The basic process steps of the bump forming method in the second embodiment of the present invention will be described herein below with reference to FIGS. 15(a) to 15(d) and FIGS. 16(a) to 16(d).

Figure 15:
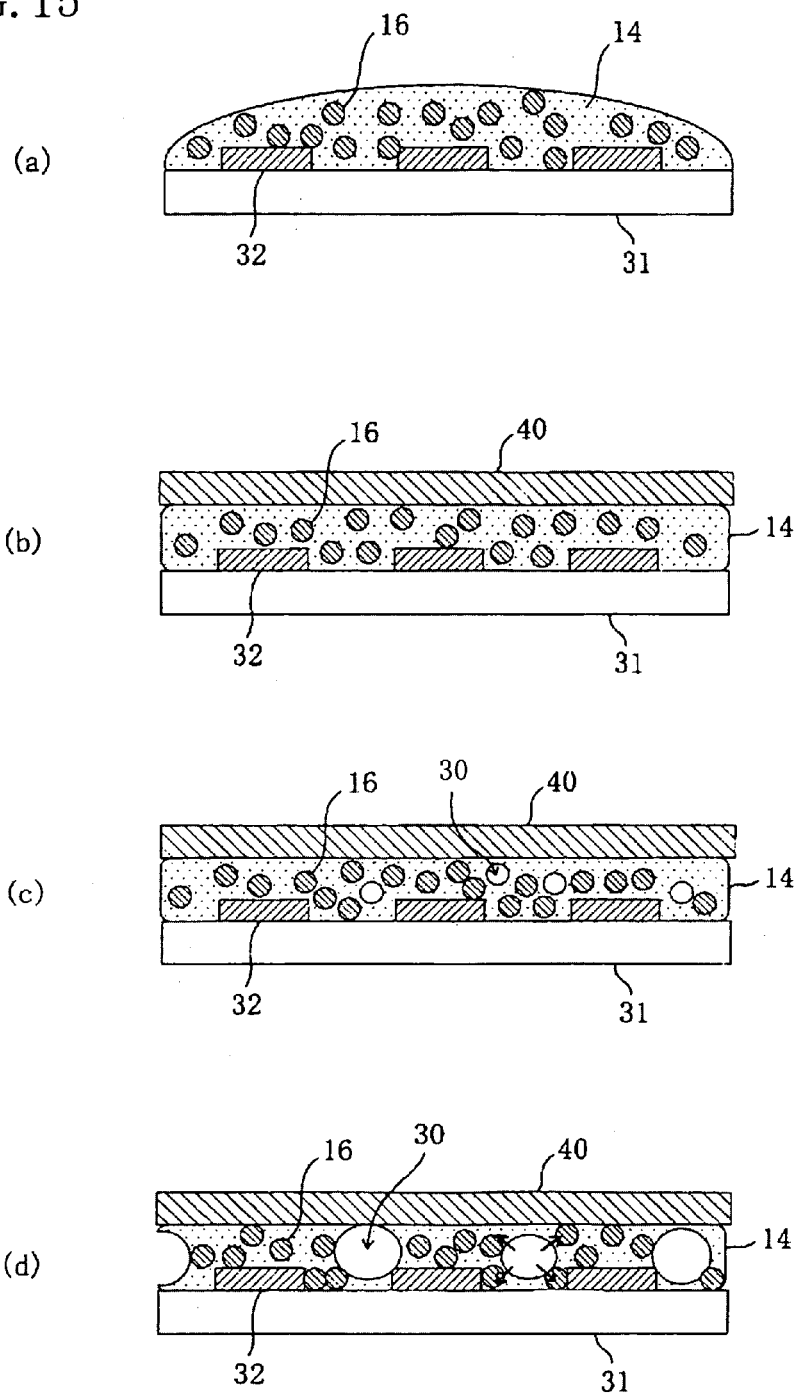
FIG. 15(a) to 15(d) are step-by-step cross-sectional views showing a bump forming method in a second embodiment of the present invention.

First, as shown in FIG. 15(a), the resin 14 containing the solder powder 16 and a gas bubble generating agent (not shown) is supplied onto a substrate 31 having a plurality of electrodes 32. Then, as shown in FIG. 15(b), a flat plate 40 is disposed on the surface of the resin 14. The steps shown herein may also be such that the substrate 31 and the flat plate 40 are preliminarily disposed with a given space provided therebetween and then the resin 14 containing the solder powder and the gas bubble generating agent is supplied into the space.

When the resin 14 is heated in this state, the gas bubbles 30 are generated from the gas bubble generating agent contained in the resin 14. Then, as shown in FIG. 15(d), the resin 14 is pushed toward the outside of the generated gas bubbles 30 by the growth thereof.

Figure 16:
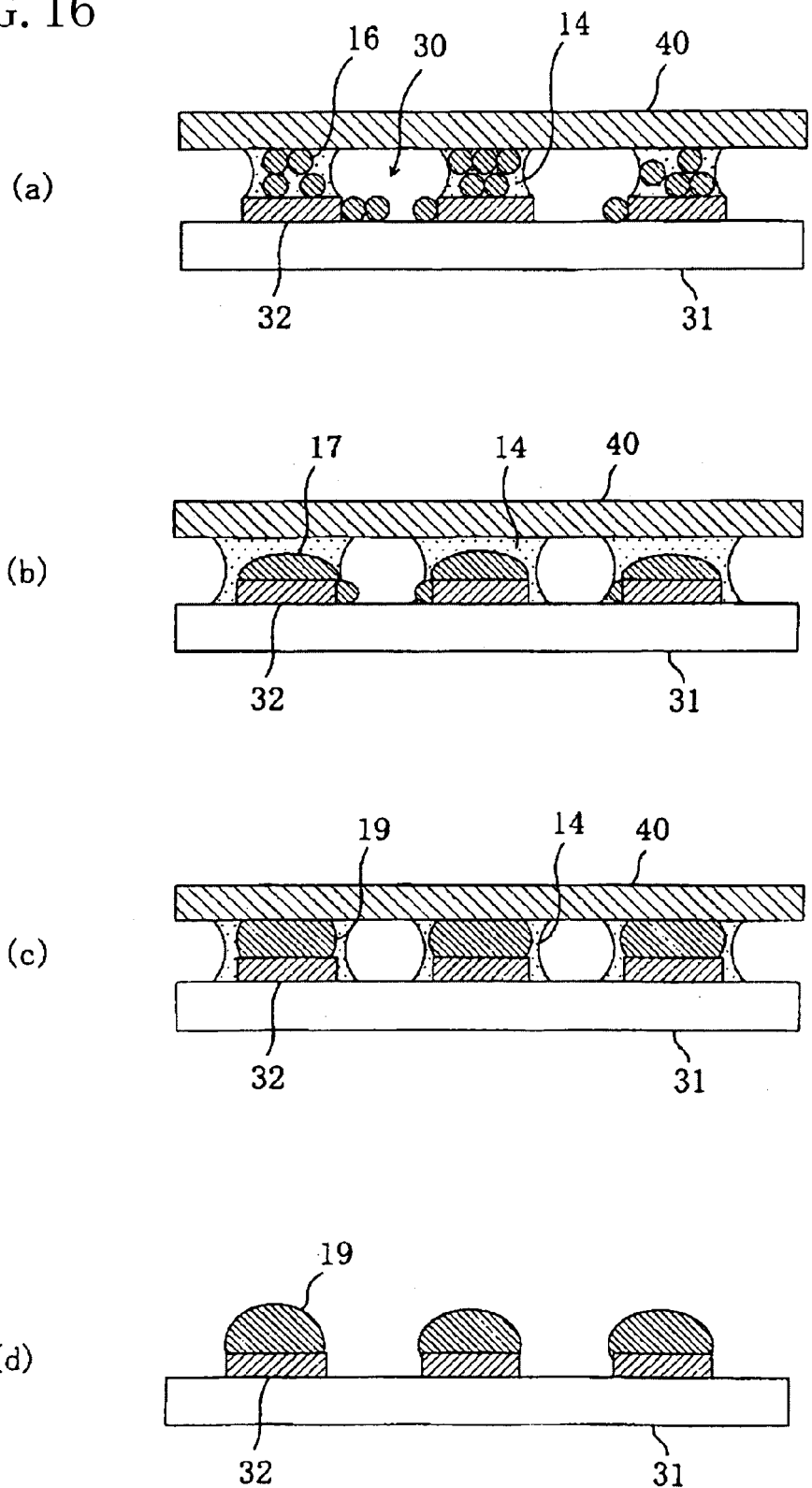
FIG. 16(a) to 16(d) are step-by-step cross-sectional views showing the bump forming method in the second embodiment.

As shown in FIG. 16(a), the resin 14 pushed to the outside is self-assembled in the form of columns at the interfaces with the electrodes 32 of the substrate 31 and at the interface with the flat plate 40. Then, when the resin 14 is further heated, the solder powder 16 contained in the resin 14 is melted and the individual solder powder particles 16 contained in the resin 14 self-assembled on the electrodes 32 are melt-bonded to each other, as shown in FIG. 16(b). Because each of the electrodes 32 has high wettability with respect to the melt-bonded solder powder 17, bumps 19 made of the molten solder powder are formed on the electrodes 32, as shown in FIG. 16(c). Finally, by removing the resin 14 and the flat plate 40, the substrate 31 with the bumps 19 formed on the electrodes 32 is obtained, as shown in FIG. 16(d).

In accordance with the present invention, by heating the resin 14 containing the solder powder 16 and the gas bubble generating agent which is supplied into the space between the substrate 31 and the flat plate 40, the gas bubbles 30 are generated from the gas bubble generating agent so that the resin 14 is pushed toward the outside of the gas bubbles 30 by the growth thereof and allowed to be self-assembled between the electrodes 32 of the substrate 31 and the flat plate 40. Then, by melting the solder powder 16 contained in the resin 14 self-assembled on the electrodes 32, the bumps 19 made of the molten solder powder can be formed by self alignment on the electrodes 32 having high wettability. This allows the solder powder 16 dispersed in the resin 14 to be efficiently self-assembled on the electrodes 32 and the bumps with excellent uniformity and high productivity to be formed on the electrodes.

To the bump forming method of the present embodiment also, the various methods described in the flip chip mounting method of the first embodiment are applicable.

That is, to a temperature profile in the step of heating resin 14, the profile shown in FIG. 4 or 5 is applicable. To the variation in the gap between the substrate 31 and the flat plate 40, the method shown in FIG. 7 or 8 is applicable. For the gas bubble generating agent also, two or more materials having different boiling temperatures as shown in FIG. 10 may be used. In the same manner as shown in FIG. 11, it is also possible to melt the surface of the solder powder and form the bumps in which the interfaces between the solder powder particles are in a metallically bonded state.

For the resin 14, the solder powder 16, and the gas bubble generating agent to be used also, the materials described in the flip chip mounting method can also be appropriately selected and used.

Figure 17:
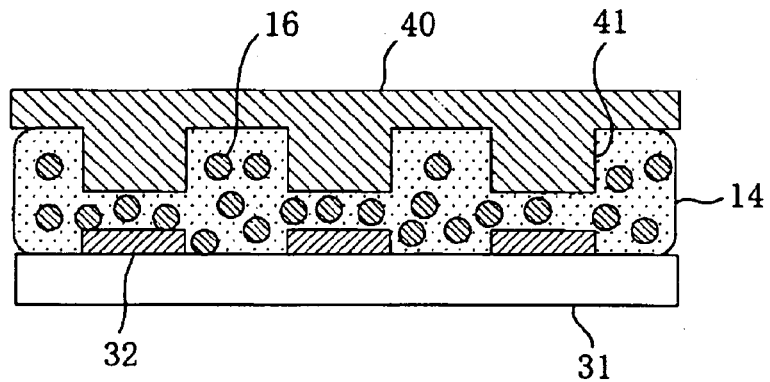
FIG. 17 is a view showing a structure of a flat plate in the present invention.

In the method shown in FIGS. 15(a) to 15(d) and FIGS. 16(a) to 16(d), the flat plate 40 having a flat surface is used. However, it is also possible to use the flat plate 40 having projecting portions 41 formed in generally the same shapes as the electrodes 32 at positions facing the plurality of electrodes 32 formed on the substrate 31, as shown in FIG. 17. By thus providing large steps in the space between the substrate 31 and the flat plate 40, the resin 14 is more likely to be self-assembled on the electrodes 32 with a reduced space and, accordingly, uniform bumps can be formed. The optimum height of each of the steps is determined in accordance with the ratio of the step to the substrate 31, the flat plate 40, and the size of the gap, the viscosity of the resin, and the like.

Figure 18:
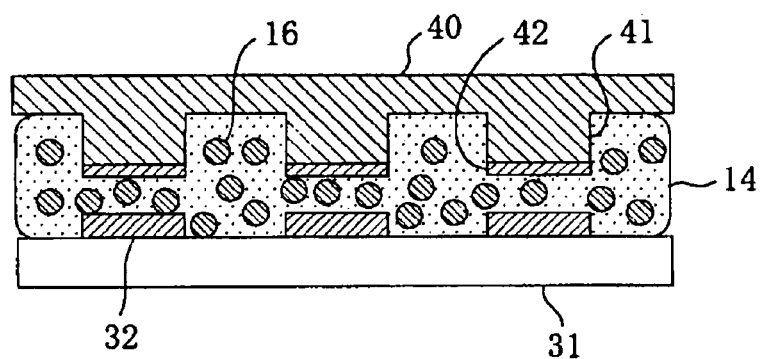
FIG. 18 is a view showing another structure of the flat plate in the present invention.

As shown in FIG. 18, the wettability with respect to the solder powder 16 can be enhanced by preliminarily forming a metal 42 on at least the surface of each of the projecting portions 41 and the bumps can be formed more easily.

The flat plate 40 having the projecting portions 41 can be formed by various methods. For example, the flat plate 40 having the projecting portions 41 can also be formed by a method in which, e.g., a die having extremely small projections and depressions is pressed against a material to be machined, such as a resin thin film, and integrally molded.

Figure 19:
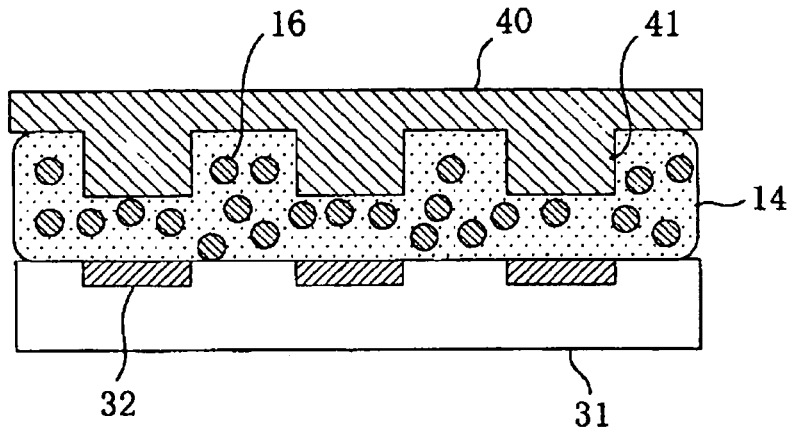
FIG. 19 is a view showing a structure in which electrodes are buried in a substrate in the present invention.

As shown in FIG. 19, in the case where the electrodes 32 are buried in the substrate 31, a place where the resin 14 is self-assembled is not determined so that, in this case, the provision of the projecting portions 41 at the flat plate 40 is particularly effective. As an example of the substrate 31 in which the electrodes 32 are buried, there can be listed a substrate on which the electrodes 32 are formed by a transfer process. There can also be listed a substrate in which another material (solder resist or the like) is buried in the space between the adjacent electrodes.

FIGS. 20(a) to 20(d) show the photographs of samples in individual steps obtained by the bump forming method shown in FIGS. 15(a) to 15(d) and FIGS. 16(a) to 16(d).

Figure 20:
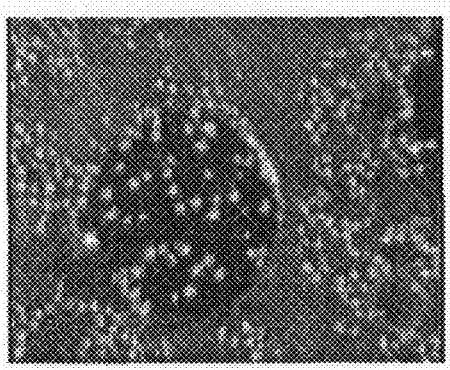
FIGS. 20(a) to 20(d) are views showing the photographs of a sample in individual steps obtained by a bump forming method in the present invention.
Figure 20:
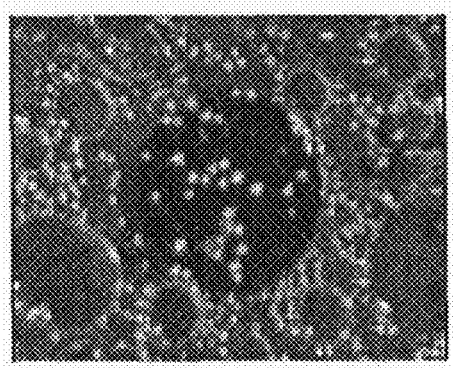
Figure 20:
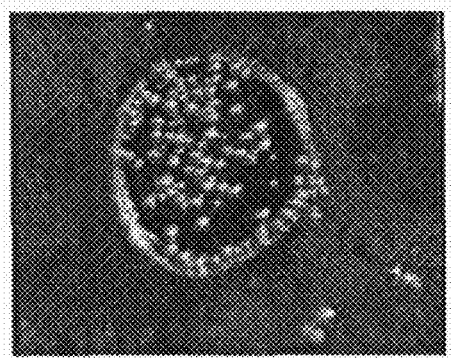
Figure 20:
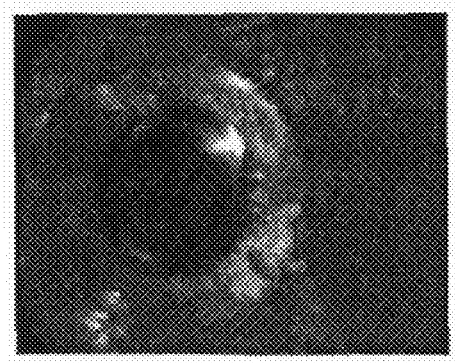

FIG. 20(a) shows the photograph at the stage where a resin (epoxy resin) containing a solder powder (SnAgCu with a melting temperature of 220° C.) and a gas bubble generating agent (dimethylamine hydrochloride with a boiling temperature of 171° C.) is supplied into the space between the substrate and the flat plate.

FIG. 20(b) is the photograph of the state in which the gas bubbles are generated from the gas bubble generating agent in the resin in the step of heating the resin. FIG. 20(c) is the photograph of the state in which the resin is self-assembled on one of the electrodes. FIG. 20(d) is the photograph of the state in which the bump is formed on the electrode by melting the solder powder in the resin self-assembled on the electrode. It can be recognized that the bump is formed by self alignment on the electrode.

Figure 21:
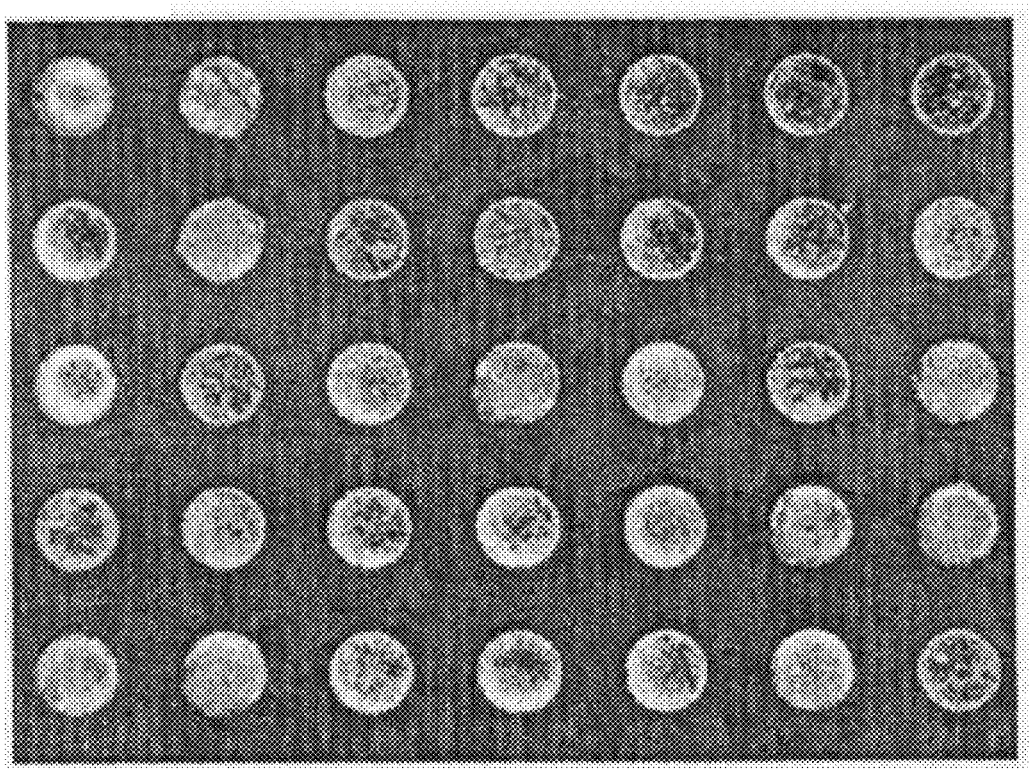
FIG. 21 is a view showing the photographs of the sample in a step obtained by the bump forming method in the present invention.

FIG. 21 is the photograph of the state in which the bumps are formed in accordance with the method of the present invention by supplying a bisphenol F epoxy resin containing 40% by weight (8% by volume) of SnAgCu (with a particle diameter of 10 to 25 μm) as the solder powder and 3% by weight of isopropyl alcohol as the gas bubble generating agent to a substrate of 7×7 mm (with 165 electrodes occupying an area of 300μ φ). As shown in FIG. 21, the bumps were uniformly formed on all the electrodes and the remainder of the solder powder was not observed on the substrate except on the electrodes.

Heretofore, the flip chip mounting method and the bump forming method according to the present invention have been described. An apparatus for fabricating a flip chip mounting body or a substrate with bumps by practicing these methods can be implemented with a fabricating apparatus 50 as shown in the block diagram of FIG. 22.

Figure 22:
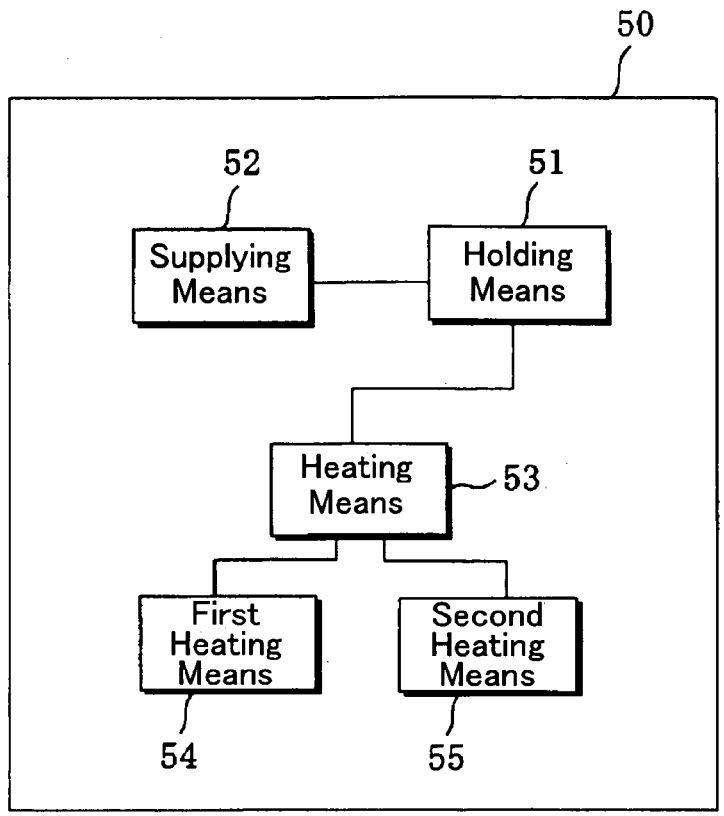
FIG. 22 is a block diagram showing a structure of a flip chip mounting apparatus in the present invention.
Figure 23:
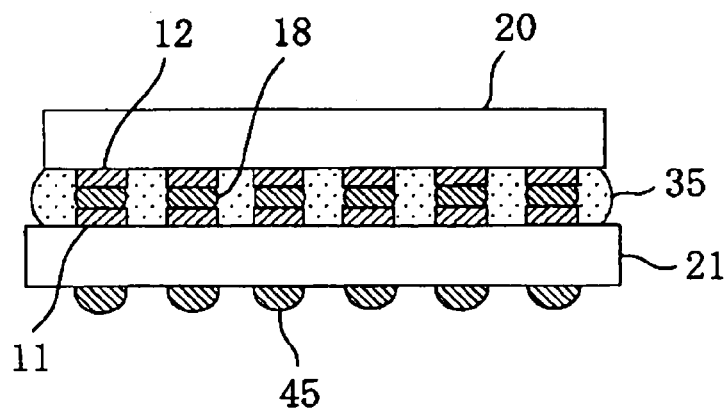
FIG. 23 is a view showing a structure of a CSP as a flip chip mounting body in the present invention.

As shown in FIG. 22, the fabricating apparatus 50 comprises holding means 51 for holding the semiconductor chip 20 and the circuit board 21 in mutually facing relation with a given space provided therebetween, supplying means 52 for supplying the resin 14 containing the solder powder 16 and the gas bubble generating agent into the space between the semiconductor chip 20 and the circuit board 21, and heating means 53 for heating the resin 14. The heating means 53 has first heating means 54 for controlling a temperature to a value at which the gas bubbles are generated from the gas bubble generating agent contained in the resin 14 and second heating means 55 for controlling the temperature to a value at which the solder powder contained in the resin 14 is melted.

The holding means 51 has an additional alignment mechanism for aligning the positions of the electrode terminals of the semiconductor chip 20 with respect to those of the connecting terminals of the circuit board 21. When the resin in the form of a paste, the supplying means 52 can use a dispenser or the like and the heating means 53 can use a heating stage (hot plate) or a heating box (oven) heated with a hot blast or an infrared ray.

In the fabricating apparatus 50, the resin 14 heated with the first heating means 54 is pushed toward the outside of the gas bubbles generated from the gas bubble generating agent by the growth thereof and self-assembled between the connecting terminals 11 of the circuit board 21 and the electrode terminals 12 of the semiconductor chip 20. By further melting the solder powder 16 contained in the resin 14 self-assembled between the terminals with the second heating means 55, the connectors 22 are formed between the terminals, whereby the flip chip mounting body is fabricated.

The fabricating apparatus 50 can also be used as a bump forming apparatus for forming bumps on the plurality of electrodes 32 formed on the substrate 31.

Specifically, it is possible to hold the flat plate 40 at a position facing the substrate 31 with a given space provided therebetween with the holding means 51, supply the resin 14 containing the solder powder 16 and the gas bubble generating agent into the space between the substrate 31 and the flat plate 40 with the supplying means 52, and heat the resin 14 with the heating means 53.

In the apparatus, the resin 14 heated with the first heating means 54 is pushed toward the outside of the gas bubbles generated from the gas bubble generating agent by the growth thereof and self-assembled on the electrodes 32 of the substrate 31. By further melting the solder powder 16 contained in the resin 14 self-assembled on the electrodes 32 with the second heating means 55, the bumps 19 are formed on the electrodes 32 and the substrate with the bumps can be formed.

A method which simultaneously performs the provision of electrical connection between the facing terminals of a semiconductor chip and a circuit board and the fixation of the semiconductor chip to the circuit board using a resin containing a solder powder is disclosed in each of Patent Document 5 (Japanese Laid-Open Patent Publication No. 2002-26070) and Patent Document 6 (Japanese Laid-Open Patent Publication No. HEI 11-186334). In the method disclosed in each of the documents, the respective portions of the facing terminals of the semiconductor chip and the circuit board which are in contact with each other are soldered by melting the solder powder contained in the resin and then the semiconductor chip is encapsulated in and fixed to the circuit board by curing the resin. Although the method disclosed in each of the documents apparently seems to be a similar technique to the present invention, the method solders the terminals by a so-called reflow process. Accordingly, the solder powder is dispersed in the resin even after resin encapsulation and, unlike in the present invention, the molten solder powder is not self-assembled between the facing terminals. Therefore, the method disclosed in each of the documents is a technique essentially different from the present invention.

On the other hand, a method which simultaneously performs the provision of electrical connection between the facing terminals of a semiconductor chip and a circuit board and the fixation of the semiconductor chip to the circuit board, each using a resin containing conductive particles (low-melting-point metal filler), is described in each of Patent Document 7 (Japanese Laid-Open Patent Publication No. 2004-260131) and Non-Patent Document 1 (Masahiro Yasuda et al., "Self-Organized Joining Assembly Process by Electrically Conductive Adhesive Using Low Melting Point Filler" 10th Symposium on "Microjoining and Assembly Technology in Electronics, pp. 183 to 188, 2004). Each of the documents discloses a technique in which conductive particles selectively form self-organized connectors between terminals by using a resin having an oxidizing/reducing ability based on the aggregation and wetting of the molten metal filler contained in the resin.

However, Patent Document 7 and Non-Patent Document 1 do not go beyond indicating the probability of a process which selectively (in a self-assembled manner) joins the facing terminals and merely causes aggregation (self-assembly) by relying only on the wettability of the molten conductive particles. As a result, it is difficult to uniformly form the connectors between the terminals.

As described above, the present invention has been achieved based on the recognition that, since the resin containing the solder powder does not function as the "sea" in which the molten solder powder freely moves, the bonding process of the molten solder powder particles does not uniformly proceed and, consequently, uniform connectors cannot be formed between the terminals. Therefore, by applying the method according to the present invention, it is possible to perform high-yield flip chip mounting of a semiconductor chip having a large number of electrode terminals so that a useful method applicable to a mass production process is provided.

Although the present invention has thus been described using the preferred embodiments thereof, such a description is not a restrictive matter and various modifications can be naturally made. For example, it is also possible to use, as the circuit board 21, an interposer 21 having the plurality of connecting terminals 11 formed on the surface thereof and a plurality of external terminals 45 formed on the back surface thereof, as shown in FIG. 22. In this case, the flip chip mounting body has a structure as a CSP (chip size package) or a BGA (ball grid array) in which the semiconductor chip 20 is mounted on the interposer 21.

INDUSTRIAL APPLICABILITY

In accordance with the present invention, it is possible to provide a flip chip mounting method which is applicable to the flip chip mounting of a next-generation LSI and high in productivity and reliability as well as a bump forming method.

What is claimed is:

1. A flip chip mounting body comprising a circuit board having a plurality of connecting terminals and a semiconductor chip having a plurality of electrode terminals and disposed in facing relation to the circuit board such that the connecting terminals of the circuit board are electrically connected to the electrode terminals of the semiconductor chip, wherein
the connecting terminals are electrically connected to the electrode terminals via connectors formed therebetween by supplying a resin containing a solder powder and a gas bubble generating agent into a space between the circuit board and the semiconductor chip, causing the resin to be self-assembled between the connecting terminals and the electrode terminals, and melting the solder powder in the self-assembled resin.

2. The flip chip mounting body of claim 1, wherein the circuit board is composed of an interposer having a plurality of external terminals, the flip chip mounting body having a structure as a CSP or a BGA in which the semiconductor chip is mounted on the interposer.

3. The flip chip mounting body of claim 1, which is fixed with a resin supplied into the space between the circuit board and the semiconductor chip.

4. A flip chip mounting apparatus for flip chip mounting a semiconductor chip on a circuit board, the flip chip mounting apparatus comprising:
holding means for holding the semiconductor chip and the circuit board in mutually facing relation with a given space provided therebetween;
supplying means for supplying a resin containing a solder powder and a gas bubble generating agent into the space between the semiconductor chip and the circuit board; and
heating means for heating the resin, wherein
the heating means has first heating means for controlling a temperature to a value at which gas bubbles are from the gas bubble generating agent contained in the resin and second heating means for controlling the temperature to a value at which the solder powder contained in the resin is melted.

5. The flip chip mounting apparatus of claim 4, wherein
the resin heated with the first heating means is pushed toward the outside of the gas bubbles generated from the gas bubble generating agent by growth of the gas bubbles and self-assembled between connecting terminals of the circuit board and electrode terminals of the semiconductor chip and
connectors are formed between the terminals by melting the solder powder contained in the resin self-assembled between the terminals with the second heating means.

6. A bump forming apparatus for forming bumps on a plurality of electrodes formed on a substrate, the bump forming apparatus comprising:
holding means for holding a flat plate at a position facing the substrate with a given space provided therebetween;
supplying means for supplying a resin containing a solder powder and a gas bubble generating agent into the space between the substrate and the flat plate; and
heating means for heating the resin, wherein
the heating means has first heating means for controlling a temperature to a value at which gas bubbles are from the gas bubble generating agent contained in the resin and second heating means for controlling the temperature to a value at which the solder powder contained in the resin is melted.

7. The bump forming apparatus of claim 6, wherein
the resin heated with the first heating means is pushed toward the outside of the gas bubbles generated from the gas bubble generating agent by growth of the gas bubbles and self-assembled on the electrodes of the substrate and
the bumps are formed on the electrodes by melting the solder power contained in the resin self-assembled on the electrode with the second heating means.

* * * * *